United States Patent
Coene et al.

(10) Patent No.: US 7,224,296 B2
(45) Date of Patent: May 29, 2007

(54) ERROR-CORRECTING BINARY RUN-LENGTH-LIMITED PRODUCT-CODE

(75) Inventors: Willem Marie Julia Marcel Coene, Eindhoven (NL); Antonius Adrianus Cornelis Maria Kalker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 81 days.

(21) Appl. No.: 10/511,216

(22) PCT Filed: Apr. 17, 2003

(86) PCT No.: PCT/IB03/01542

§ 371 (c)(1),
(2), (4) Date: Oct. 13, 2004

(87) PCT Pub. No.: WO03/088501

PCT Pub. Date: Oct. 23, 2003

(65) Prior Publication Data

US 2005/0166130 A1  Jul. 28, 2005

(30) Foreign Application Priority Data

Apr. 18, 2002  (EP) ................................. 02076526

(51) Int. Cl.
*H03M 7/00*  (2006.01)

(52) U.S. Cl. ........................ 341/59; 341/50; 714/804

(58) Field of Classification Search .................. 341/59, 341/50, 67, 65, 58; 714/804, 800, 798
See application file for complete search history.

(56) References Cited

U.S. PATENT DOCUMENTS

| | | | | |
|---|---|---|---|---|
| 6,125,466 | A | * | 9/2000 | Close et al. ................. 714/758 |
| 6,434,719 | B1 | * | 8/2002 | Livingston .................. 714/804 |
| 6,757,122 | B1 | * | 6/2004 | Kuznetsov et al. ........... 360/53 |
| 2002/0145947 | A1 | * | 10/2002 | Minamino et al. ............. 369/1 |

* cited by examiner

*Primary Examiner*—Peguy JeanPierre
(74) *Attorney, Agent, or Firm*—Michael E. Belk

(57) ABSTRACT

A signal includes a runlength limited (RLL) encoded binary d,k channel bitstream, parameter d defining a minimum number and k defining a maximum number of zeroes between any two ones of the bitstream, or vice versa. The signal further includes a number of sections of respectively N successive RLL channel bits, called RLL rows, each RLL row representing a row parity-check code-word, in which a row-based parity-check constraint for the RLL row has been realized. K sections of respectively N successive channel bits, called column parity-check rows, are located at predetermined positions of a group of M RLL rows. The column parity-check rows include column parity-check enabling channel words, each realizing a column-based parity-check constraint for all corresponding segments of at least the M RLL rows of the group that correspond to a specific column parity-check enabling channel word, thereby constituting a column parity-check codeword.

83 Claims, 15 Drawing Sheets

ERROR-CORRECTING BINARY RUN-LENGTH-LIMITED PRODUCT-CODE

This application is a 371 of PCT/IB03/01542 filed on Apr. 17, 2003.

The invention relates to a signal comprising a runlength limited (RLL) encoded binary d,k channel bitstream, wherein parameter d defines a minimum number and parameter k defines a maximum number of zeroes between any two ones of said bitstream or vice versa, comprising a number of sections of respectively N successive RLL channel bits, called RLL rows, each RLL row representing a parity-check code-word, called row parity-check code-word, in which a so-called row-based parity-check constraint for said RLL row has been realized.

Furthermore, the invention relates to a storage medium comprising such a signal.

Furthermore, the invention relates to a method for encoding a stream of user data bits comprising the step of runlength limited (RLL) encoding said stream of user data bits into a binary d,k channel bitstream comprising a number of sections of respectively N successive RLL channel bits, called RLL rows, wherein parameter d defines a minimum number and parameter k defines a maximum number of zeroes between any two ones of said bitstream or vice versa, each RLL row representing a parity-check code-word, called row parity-check code-word in which a so-called row-based parity-check constraint for said RLL row has been realized.

Furthermore, the invention relates to a corresponding device according to the preamble of claim 33.

Furthermore, the invention relates to a method for decoding such a signal or a signal being encoded according to such a method for encoding.

Furthermore, the invention relates to a device for decoding such a signal or a signal being encoded according to such a method for encoding.

In the field of mass data storage media, such as optical discs, magnetic discs and magneto-optical discs, digital surface recorders are used that are substantially narrow bandpass signaling devices. Therefore, the data to be recorded on such media is encoded such, to eliminate very long as well as very short written pits. This encoding is called "modulation coding". It typically employs a runlength limited (RLL) code which is characterized by two parameters, namely the constraints d,k, wherein d≦k. RLL-encoded binary sequences have at least d, but no more than k zeroes between any two ones. Transitions between written pits correspond to occurrences of ones. A one in the binary d,k channel bitstream corresponds to a transition between e.g. pit and land (wherein "land" defines the space between two pits). Thus, the minimum-length pit or land consists of d+1 channel bits and the maximum-length land or pit consists of k+1 channel bits.

FIG. 1 shows a bitstream of un-constrained user data 1 that are RLL encoded 2 with d,k constraints and a code rate R=m/n. Thus, an NRZ or d,k channel bit stream 3 is obtained, in which the ones represent transitions from pit to land or vice versa.

An RLL waveform 4 is recorded on a storage medium, e.g. a disc, by using lands and pits. Whenever a "1" occurs in the d,k channel bitstream 3, the RLL waveform 4 performs a transition from land to pit or vice versa. Thus, pits and lands both represent strings of zeroes of varying length, each string being preceded by a one-bit which indicates the transition between them, so that the length of a run of bits of the same polarity (pit or land) equals the number of zeroes plus one.

One of the major error sources during read-out of such a disc are random errors, due to imperfections in deriving the d,k channel bitstream from the HF (high-frequent) signal waveform. For the case of a perfect channel (without any intersymbol-interference or ISI) this waveform equals to RLL waveform 4 which is the waveform directly generated from the bipolar channel bitstream (with values equal to either +1 or −1). However, the actual HF waveform in case of a realistic channel in the presence of (linear and/or non-linear) ISI is a rounded version of RLL waveform 4, with lower amplitude at shorter runlengths, according to the eye-pattern. This actual HF-waveform is used for bit-detection, and here so-called "single-bit transition-shift errors" (SBTSE) can be made.

Random errors (in the optical recording channel) most often lead to a shift of a transition ("1"-bit in the d,k channel bitstream) over a distance of a single bit. A corresponding error event 5 is depicted in the channel bitstream 6 that is detected from the actual HF waveform. This error event 5 results in a shift of the transition from the first land to the second pit over a distance of a single bit. Such an error event 5 is a SBTSE. In the detected (erroneous) d,k bitstream 7 such a SBTSE results in a shift of a "1" over a distance of one bit.

For random errors of this specific type, it is advantageous not to use the standard error correction coding (ECC) with algebraic Reed-Solomon error-correcting codes since the latter requires two user bytes (called parity-bytes) of overhead for correction of a single random error (one parity-byte for location of the error and one parity-byte for correction of the byte-value).

Instead, specifically designed parity-check RLL codes can be used to detect the presence of such a random error, and channel side-information, like the magnitude of phase-errors generated at each transition of the HF waveform in a PLL, can be used to locate the error.

Several proposals for such parity-check RLL coding have been made, such as in H. M. Hilden, D. G. Howe, E. J. Weldon, "Shift Error Correcting Modulation Codes", IEEE Trans. Magn., vol. 27, 1991, pp. 4600-4605; Y. Saitoh, I. Ibe, H. Imai, "Peak-Shift and Bit Error-Correction with Channel Side Information in Runlength-Limited Sequences", 10th Int. Symp. Applied Algebra, Algebraic Algorithms and Error-Correcting Codes, vol. AAECC-10, 1993, pp. 304-315; P. Perry, M.-C. Lin, Z. Zhang, "Runlength-Limited Codes for Single Error-Detection with Mixed Type Errors", IEEE Trans, Inform. Theory, vol. 44, 1998, pp. 1588-1592; S. Gopalaswamy, J. Bergmans, "Modified Target and Concatenated Coding for d=1 Constrained Magnetic Recording Channels", Proceedings of the ICC 2000, New Orleans, Jun. 18-22, 2000; and H. Sawaguchi, M. Kondou, N. Kobayashi, S. Mita, "Concatenated Error Correction Coding for High-Order PRML Channels", Proceedings of Globecom 1998, Sidney, pp. 2694-2699.

Furthermore, one of the inventors of the present invention published the idea to use so-called combi-codes for parity-check RLL coding, in: W. M. J. Coene, H. P. Pozidis, J. W. M. Bergmans, Title: "Run-Length Limited Parity-Check Coding for Transition-Shift Errors in Optical Recording", Proceedings of Globecom 2001, Paper SPS01_6, San Antonio (USA), Nov. 25-29, 2001.

In the latter reference it was shown that for the case of a single SBTSE the overhead for random-error correction was reduced to a single user-bit, with error-location handled via channel side-information, and disadvantages of previous schemes for parity-check RLL coding have been eliminated.

The procedure to use channel side-information for SBTSE is to search among all transitions that are detected and used in the phase-locked loop (PLL) for the purpose of timing-recovery, for the transition that has the phase-error with the largest absolute value and then shift backwards the corresponding transition (or "1"-bit) in the d,k channel bitstream. However, this procedure may not be 100% full-proof: there can also be large phase-errors that correspond to error-free transitions, quantization of phase-errors may have an effect, etc.

Therefore, it is an object of the present invention to provide an alternative way for error-location, where the need to use channel side-information is avoided, or at least, reduced considerably.

This object is achieved by a signal comprising an RLL encoded binary d,k channel bitstream according to the above-mentioned type characterized in that K sections of respectively N successive channel bits, called column parity-check rows, are located at predetermined positions of a group of M RLL rows, K, N and M being integer values, said column parity-check rows comprising a plurality of column parity-check enabling channel words, wherein each of said column parity-check enabling channel words realizes a so-called column-based parity-check constraint for all so-called corresponding segments of at least said M RLL rows of said group that correspond to a specific column parity-check enabling channel word, and constitute together with said column parity-check enabling channel word the column parity-check codeword.

The object is further achieved by providing a storage medium storing such a signal.

The object is further achieved by providing a method for encoding a stream of user data bits according to the above-mentioned type characterized by the further step of: generating K sections of respectively N successive channel bits, called column parity-check rows, at predetermined positions of a group of M RLL rows, K, N and M being integer values, said parity-check rows comprising a plurality of column parity-check enabling channel words, wherein each of said column parity-check enabling channel words realizes a so-called column-based parity-check constraint for so-called corresponding segments of at least said M RLL rows of said group that correspond to a specific column parity-check enabling channel word, and constitute together with said column parity-check enabling channel word the column parity-check codeword.

The object is further achieved by providing a corresponding device for encoding a stream of user data bits according to claim 33.

Furthermore, the object is achieved by a method for decoding a signal being encoded according to such a method for encoding a stream of user data bits according to claim 35.

Furthermore, the object is achieved by a corresponding device according to claim 47 for decoding a signal being encoded according to such a method for encoding a stream of user data bits.

The basic idea of the invention is to apply a two-dimensional code structure, namely a so-called product code, to the RLL encoded binary d,k channel bitstream. Such a product code provides a powerful error-correction technique.

So-called column-based parity-check constraints are constructed over columns that consist of RLL encoded segments from different RLL rows. However, the columns need not necessarily be vertically arranged but may also be arranged in such a way that in each RLL row there is one segment of the d,k channel bitstream that corresponds by means of a predetermined allocation to a specific column parity check segment, e.g. in a transversal way. Therefore, speaking in general terms, column parity-check segments of column parity-check rows realize the column-based parity-check constraint for all corresponding segments of all RLL rows of the group (cluster, or product-code word), wherein each of these corresponding segments correspond to a specific column parity-check segment. It is not mandatory that these corresponding segments are located at the same (horizontal) position within the different RLL rows, even though this is preferred, thus resulting in the latter case in exactly vertically oriented columns constituting the column parity-check codewords.

Random channel errors can easily be located at crossing points between erroneous parity-check rows (or row parity-check codewords) and erroneous parity-check columns (or column parity-check codewords). Thus, the need to use channel side-information is reduced to a large extent if not completely removed as is possible for some particular cases.

Preferably, for a non-trivial d- and k-constraints, thus excluding d=0 and k=0, at least two column parity-check rows are provided for each group of RLL rows. Thus, the RLL constraints can be realized within the column parity-check rows as well. Furthermore, DC-control is thus enabled.

Preferably, there are provided so-called merging segments between the column parity-check segments within the column parity-check rows. These merging segments facilitate to realize the RLL constraints when concatenating successive words, and to enable DC-control.

These merging segments are preferably respectively arranged over a plurality of successive channel bits and are thus arranged in a row-based manner. Alternatively these merging segments may be arranged in a column-based manner.

Further advantageous developments are defined in the dependent claims. These and other aspects of the invention will be apparent from and elucidated with reference to the embodiments described hereinafter with reference to the accompanying drawing, in which:

Figure 1:
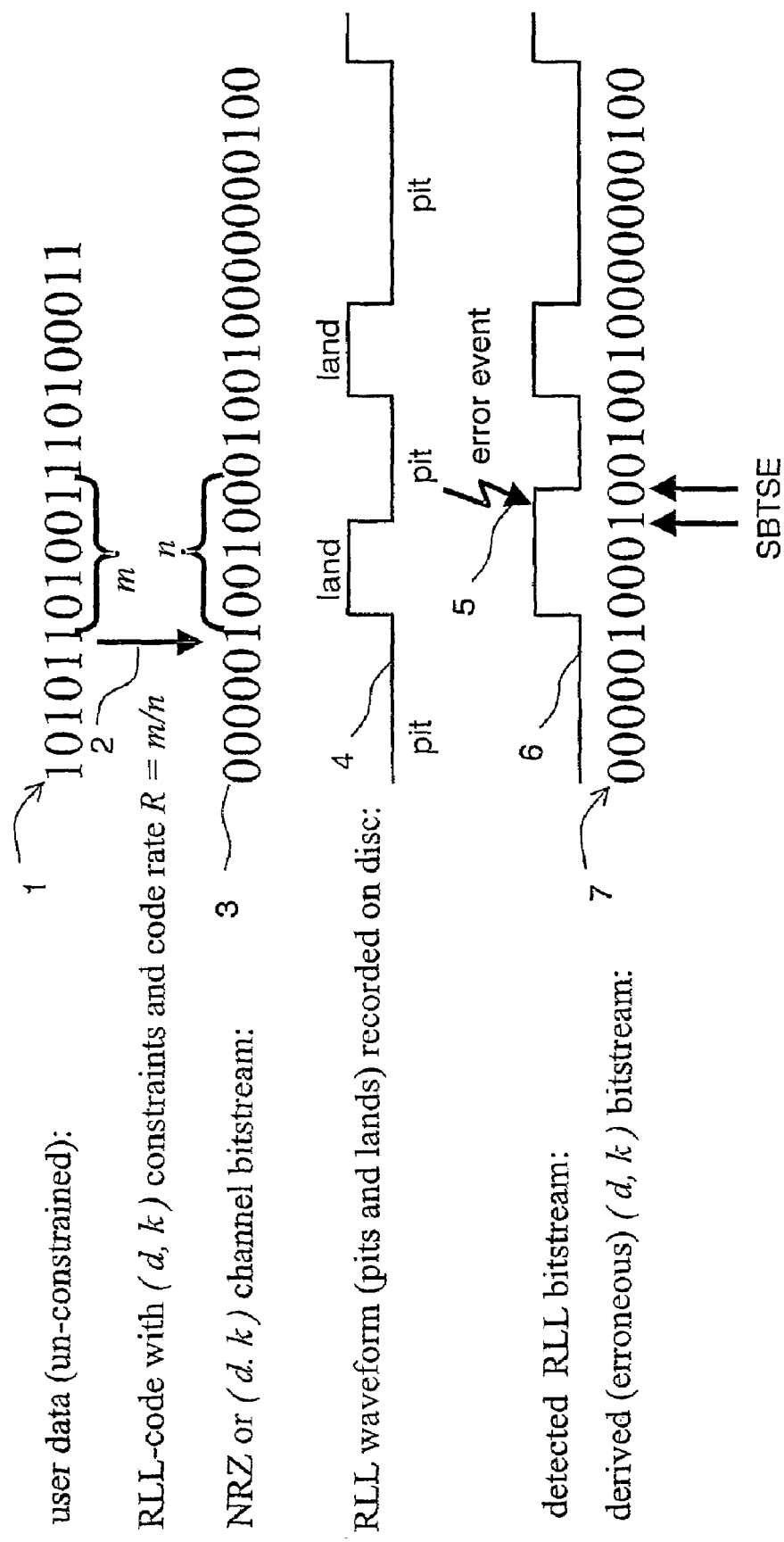
FIG. 1 shows the RLL encoding of user data with (d,k) constraints yielding a (d,k) channel bitstream, the RLL waveform recorded on a disc, the detected RLL bitstream, and the derived (d,k) bitstream as being prior art.

FIG. 1 has been explained with reference to the prior art in order to explain the background of the invention. Therefore, the above explanations with regard to FIG. 1 apply to the invention as well.

Figure 2:
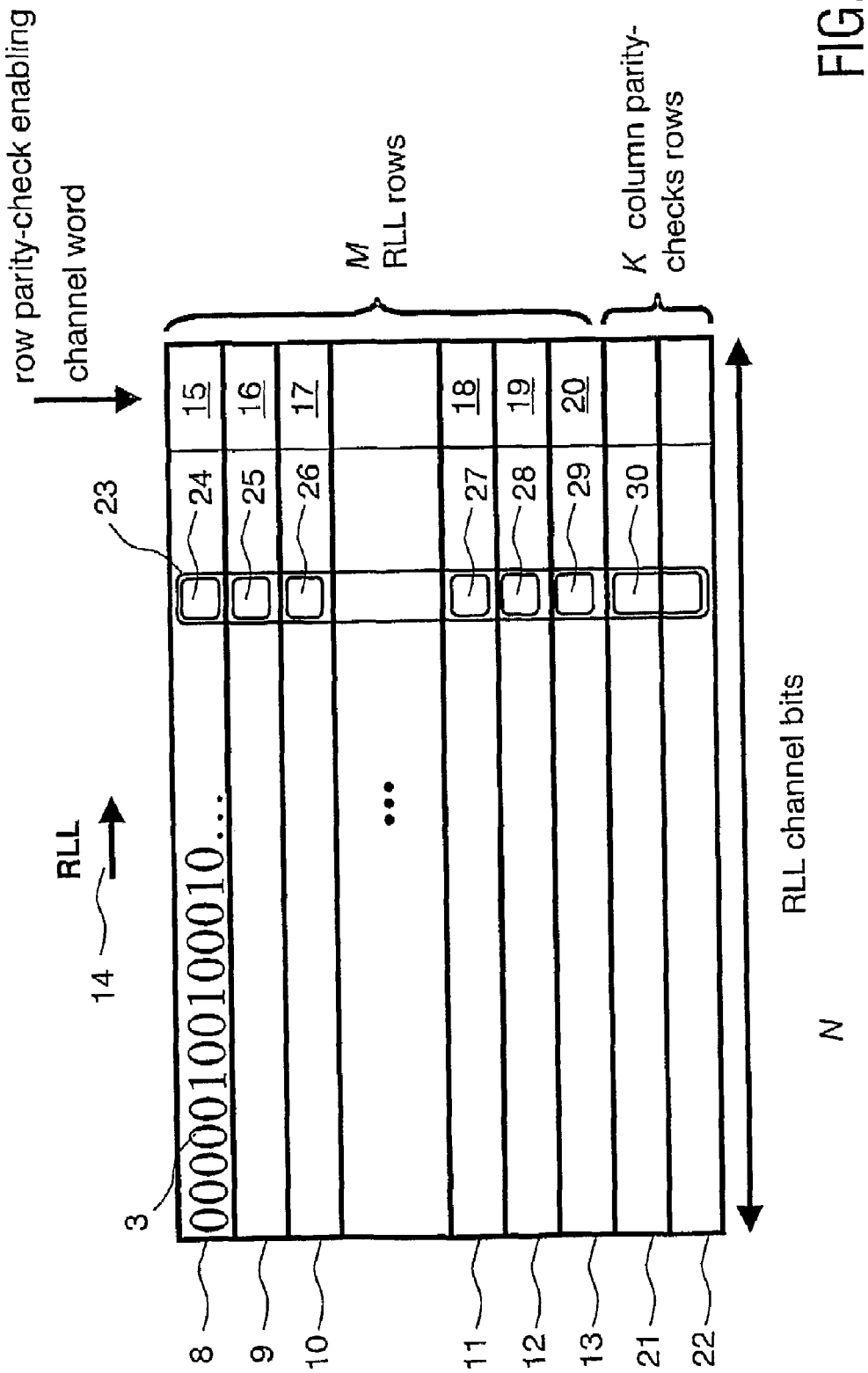
FIG. 2 shows a product code scheme for RLL parity-check coding according to a preferred embodiment of the present invention.

FIG. 2 shows a schematic representation of a product code scheme for RLL parity-check coding. Successive sections 8 to 13 of the RLL encoded binary (d,k) channel bitstream 3 are aligned underneath each other so that a two-dimensional array is generated. The direction of a (d,k) channel bitstream is indicated by a horizontal arrow 14. It is noted, that this (d,k) channel bitstream (preferably after a 1T-precoder, being an integrator modulo 2) is preferably recorded consecutively in a one-dimensional way on a storage medium, e.g. in a spiral way on a disc. Therefore, the two-dimensional illustration according to FIG. 1 does not imply that the bits of the (d,k) channel bitstream are necessarily arranged in such a two-dimensional way on a storage medium. The two-dimensional illustration only serves to realize the product-code structure with parity-check coding along orthogonal directions.

However, in view of the two-dimensional illustration each of the above mentioned sections 8 to 13 can be regarded as individual rows of RLL encoded binary (d,k) channel bits and are therefore hereinafter called RLL rows 8 to 13. For each RLL row 8 to 13, parity-check coding is applied on the (d,k) channel bitstream 3. Thus, a so-called row parity-check row parity-check enabling channel word 15 to 20 is applied for each RLL row 8 to 13, hereby constituting a row parity-check codeword for each of the RLL rows 8 to 13. The row parity-check enabling channel words are located at predetermined positions, not necessarily the same in each row; only for the purpose of simplicity, they are all aligned at the end of the rows in FIG. 2.

This can be done either by appending such row parity-check enabling channel words 15 to 20 at a certain position of such an RLL row 8 to 13, e.g. at the end of an RLL row 8 to 13, as e.g. being described in P. Perry, M.-C. Lin, Z. Zhang, "Runlength-Limited Codes for Single Error-Detection with Mixed Type Errors", IEEE Trans. Inform. Theory, vol. 44, 1998, pp. 1588-1592, or with a combi-code scheme, where the last encoded user-word (byte) realizes the corresponding parity-check constraint, called row-based parity-check constraint, as being described in W. M. J. Coene, H. P. Pozidis, J. W. M. Bergmans, "Run-length Limited Parity-Check Coding for Transition-Shift Errors in Optical Recording", Proceedings of Globecom 2061, Paper SPS01_6, San Antonio (USA), Nov. 25-29, 2001.

For detection of single SBTSEs the row-based parity-check constraint $p_{2H}$ is used, that is:

$$p_{2H} = \text{Mod}\left[\sum_{i=0}^{N-1} i \cdot b_i, 2\right] = 0 \qquad (1)$$

with $b_i$ being successive bits of the (d,k) channel bit stream of a certain RLL row and N being the number of successive bits of the (d,k) channel bitstream of that RLL row.

The parity-check coding along the RLL rows enables to detect the occurrence of a single SBTSE error.

However, for location of the error a further information is needed. Therefore, for location of the error a further parity-check constraint is applied, namely a column-based or vertical parity-check constraint with error-detecting capability. This column-based parity-check constraint is realized by a number of K (in the example of FIG. 2 of K=2) column parity-check rows 21, 22 that are added to a group of M RLL rows 8 to 13. Each of these K column parity-check rows 21, 22 comprises a plurality of column parity-check enabling channel words 30 that may be arranged as described hereinafter with reference to FIG. 11 to 16. Each of these column parity-check enabling channel words 30 is allocated to a certain row-part of corresponding width of each of the M RLL rows 8 to 13, which are called corresponding row-column intersections (corresponding segments) 24 to 29. The width of such a column parity-check enabling channel word 30 or such a corresponding row-column intersection 24 to 29 can be one or more than one bit (L bits).

Thus, if the corresponding row-column intersections 24 to 29 that correspond to a specific column parity-check enabling channel word 30 are located at the same position within an RLL row 8 to 13 as the column parity-check enabling channel word 30 in the column parity-check row 21, 22 a column 23 of vertical orientation is generated, comprising M (or M+1) corresponding row-column intersections 24 to 29 and at least one column parity-check enabling channel word 30 that is either located at one of the column parity-check rows 21, 22 (cf. FIG. 7, 9, 10, 15, 16) or spread over a number, preferably all K column parity-check rows 21, 22 (as being illustrated in FIG. 2, 5, 6, 11-14).

Figure 3:
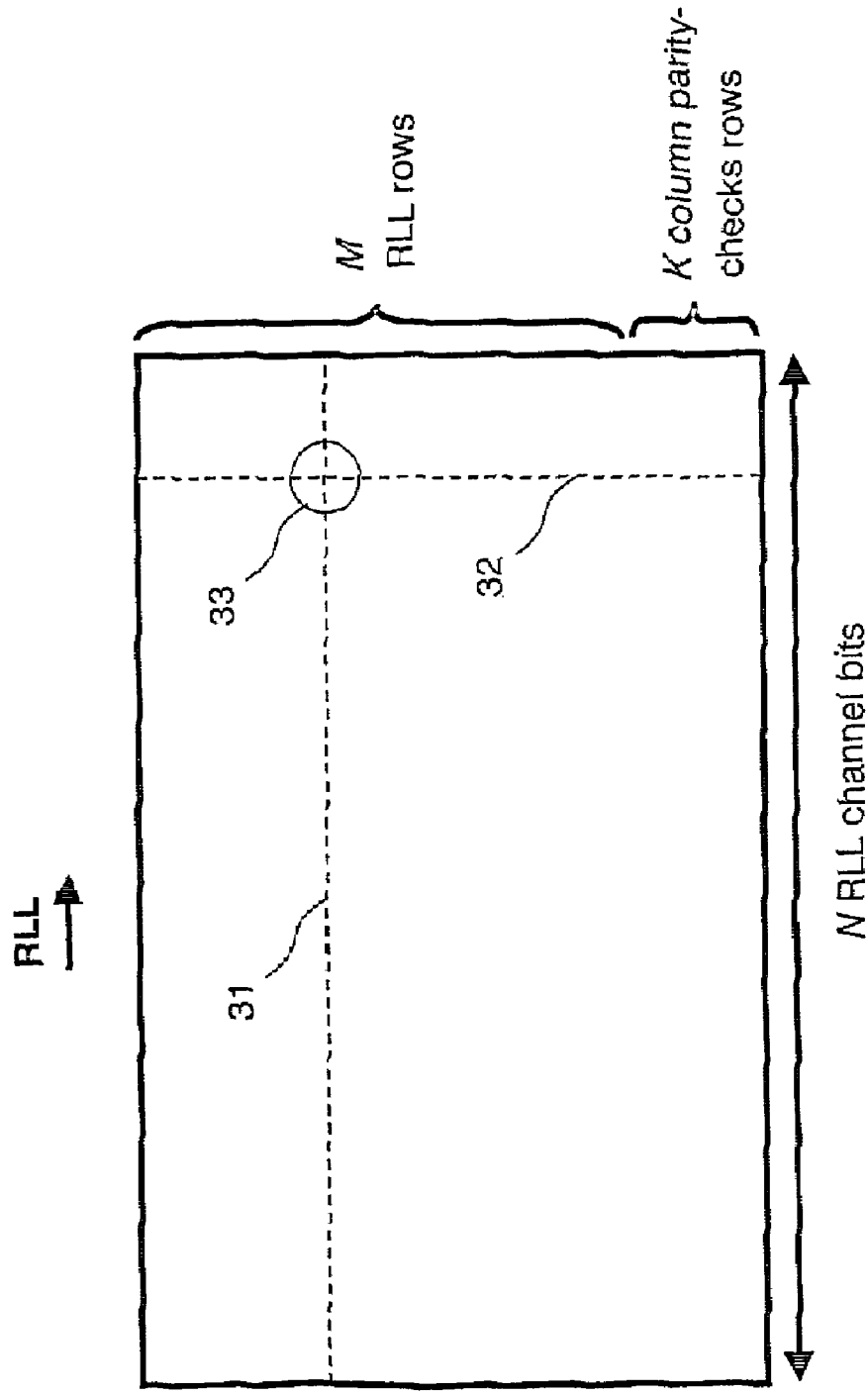
FIG. 3 shows a scheme for correction of a single-error event.

FIG. 3 shows a single SBTSE event that has occurred in an erroneous row 31.

Therefore, decoding of the row-based parity-check indicates the position of this erroneous row 31. Furthermore, this error event has occurred in an erroneous column 32. Therefore, decoding of the column-based parity-check indicates the position of this erroneous column 32. As a result, the error event is located at the crossing point 33 of the erroneous row 31 and the erroneous column 32. Thus, the corresponding erroneous RLL word at the row-column intersection can be located easily. If the segment width is 1 bit, then the corresponding bit can be easily corrected as well.

In case of a single SBTSE, however, two neighbouring bits are affected in the d,k bitstream. Thus, two neighbouring columns are indicated as being erroneous. Thus, both erroneous bits of the (d,k) channel bitstream occurring by such a single SBTSE can easily be located and corrected.

Figure 4:
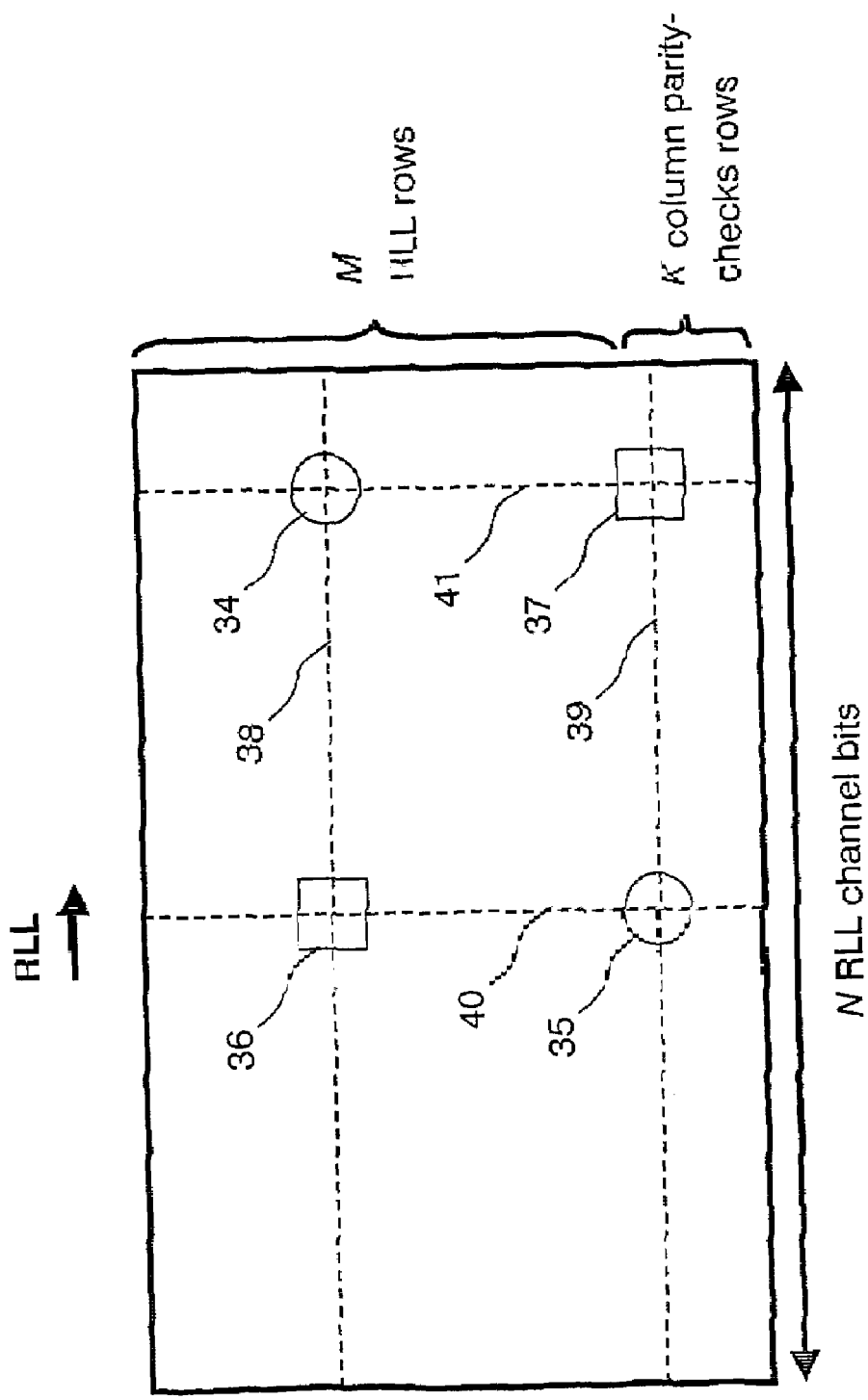
FIG. 4 shows a scheme for correction of a double-error event.

For two independent random errors in the product code scheme for RLL parity-check coding, the situation is more complicated. FIG. 4 shows two error events 34, 35 leading to the detection of erroneous rows 38 and 39 as well as erroneous columns 40, 41. The detection of two erroneous rows and columns each, results in four crossing points. It is assumed as a practical example that for each row (or column) only a single error can be detected, so that both errors must be in different rows and different columns. Then, it is apparent that only two possible corrections can be applied, arranged along the diagonals of the 2×2 set of crossing points.

In general, for r random errors in the product code scheme for RLL parity-check coding, there are r!=1·2·3· . . . ·r possible solutions.

In order to select the correct solution, namely which correction pattern has to be chosen, channel side-information is used. For instance, information from the phase-errors of the transitions in the bipolar bitstream can be used, as described above. However, only the phase-errors of those transitions of the RLL-words located at the intersections of rows and columns that have been identified to be erroneous as a result of the decoding of the parity-check along columns and along rows and thus, only a very small amount of channel side-information is needed. Note that no channel side-information at all is needed for the case with exactly one erroneous column and one erroneous row in the group (or cluster) of rows.

We assume now a situation where the width of a column is exactly one bit. Note that although the RLL-rows satisfy the d,k RLL constraints, the 1-bit wide columns generated in the group (or cluster) of rows do not satisfy any RLL constraint. According to an embodiment of the present invention the parity of the bits along each column are used as a column parity-check. This requires one extra user-bit per column, which implies 1/R channel bits with R being the rate of the runlength-limited (RLL) code with its d,k constraints. For instance, for R=½ (and d=2), this requires two channel bits per column for the column parity-check segment. These bits are arranged into two successive rows, where parity "0" is e.g. realized with "00" or "11" as channel bits in the successive row location, and parity "1" is e.g. realized with "01" or "10" as channel bits in the successive row locations. An alternative choice could be that parity "0" is realized with "01" or "10" and parity "1" with "00" or "11".

Figure 5:
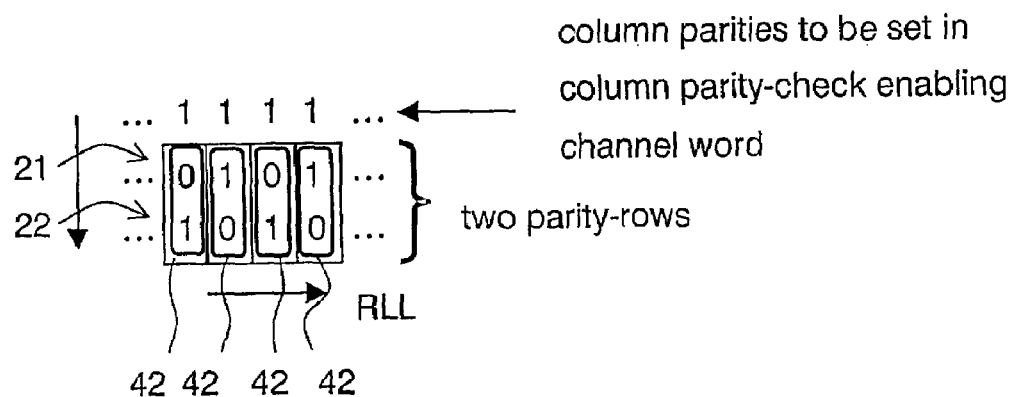
FIG. 5 shows a bitstream in the column parity-check rows according to a further embodiment of the present invention.

FIG. 5 illustrates this situation for column parities "1", "1", "1", "1" yielding e.g. parity-check segments 42 "01", "10", "01", "10" in the two column parity-check rows 21, 22.

A problem arises when, as illustrated in FIG. 5, successive vertical parities "1" are needed in successive (1-bit wide) columns. This leads to the pattern depicted in FIG. 5 which automatically excludes all d-constraints larger than d=1.

Figure 6:
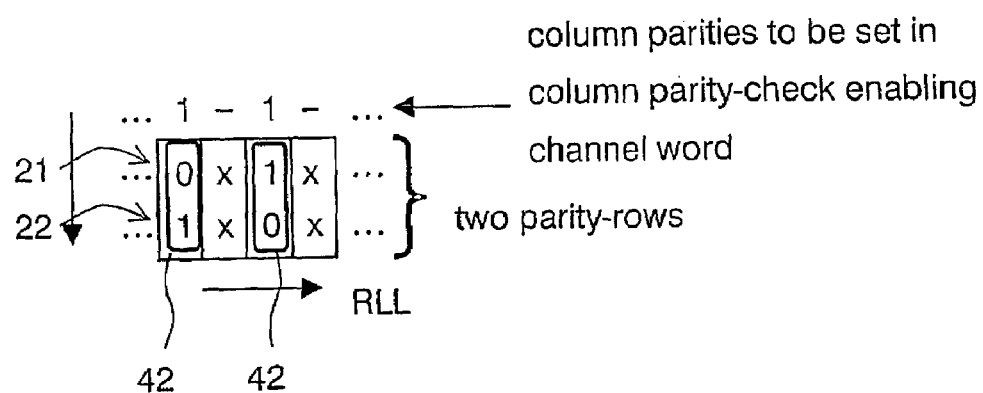
FIG. 6 shows the bitstream in the column parity-check rows according to a still further embodiment of the present invention.

FIG. 6 shows a solution for this problem wherein the vertical parity, e.g. "1", is encoded either for only the even-numbered (1-bit wide) columns, or for only the odd-numbered (1-bit wide) columns. I.e. every second bit in the column parity-check rows 21, 22 is not used for parity-check purposes.

As a SBTSE will always affect two neighbouring columns (that are 1-bit wide), it is sufficient to pinpoint only one of these two columns. After an erroneous column is detected it has to be decided whether the other erroneous column is positioned to the left or to the right of the detected erroneous column. The decision whether the other erroneous column is positioned to the left or to the right is based on channel side information.

The channel bits "x" of the 1-bit wide columns for which no vertical parity is encoded may be used as merging bits in order to realize the (d,k) constraints of the RLL code and/or for DC-control of the channel bitstream, this for each of the column-parity-check rows. Note that DC-control is based on keeping the running digital sum within certain bounds, wherein the running-digital sum is the integration of the bipolar channel bitstream up to a certain bit position. The integration for the running digital sum evolves in the horizontal "row" direction, and has to be evaluated first for the $1^{st}$ row, and then successively for the next column-parity-check rows.

As can be taken from FIG. 6 which shows the configuration of the channel bits in the columns, up to a d=3 constraint can be realized.

However, as the two column parity-check rows 21, 22 are encoded simultaneously, column after column, it is difficult to enable DC-control for the second row 22, because, for the second row, DC-control depends on the information encoded in the first row 21 and both rows 21, 22 are encoded simultaneously.

Figure 7:
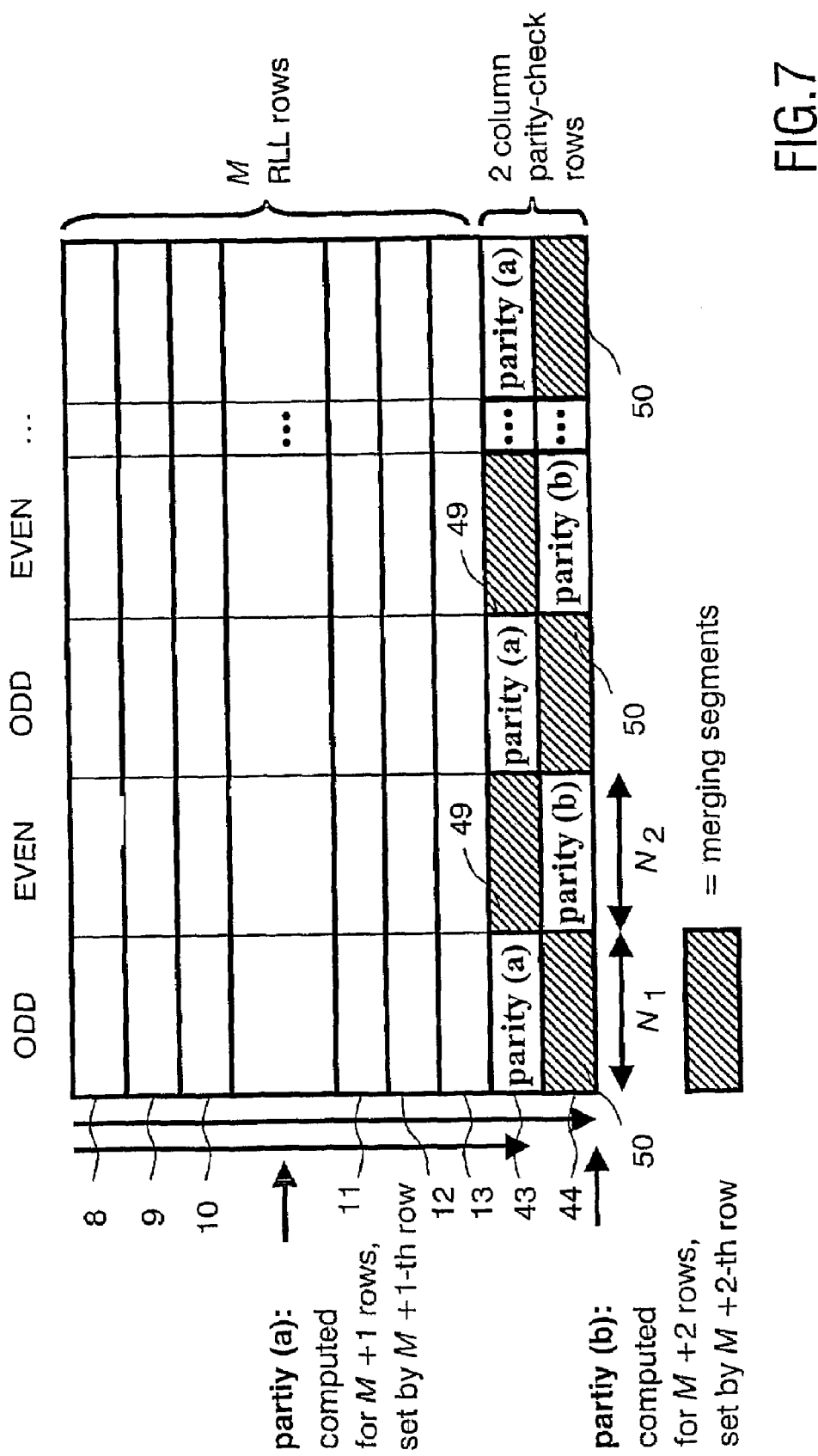
FIG. 7 shows a "zig-zag" scheme for vertical or column-based parity-check coding according to a still further embodiment of the present invention.

According to a further embodiment of the present invention, shown in FIG. 7, at least two column parity-check rows 43, 44 in addition to M RLL rows 8 to 13 are needed to realize the column-based parity-check coding. Each RLL row 8 to 13 as well as each column parity-check row 43, 44 is partitioned into alternating segments of width $N_1$ and $N_2$ channel bits. $N_1$ and $N_2$ are preferably, but not necessarily, unequal to each other, depending on the number of N RLL channel bits per row.

In the first additional column parity-check row 43 the vertical parity-check information is computed over M+1 rows into the odd-indexed segments of length $N_1$. This parity-check information is denoted by parity (a) in FIG. 7. In the second additional row 44, the vertical parity-check information is computed over M+2 rows, including the first column parity-check row 43, which has a merging area 49 (indicated by hatched segments) at this location, into the even-indexed segments of width $N_2$. This is denoted by parity (b) in FIG. 5.

It is noted, that also parity (b) may be computed over M+1 rows only, namely by excluding the first parity row 43 having a merging area 49 at this location. However, preferably, the parity-check segment parity (b) of the second column parity-check row 44 takes into account the RLL bitstream of the merging segment 49 of the first column parity-check row 43.

Thus, a so-called zig-zag scheme is used over the segments in the two additional column parity-check rows 43, 44 for encoding the vertical parity-check information, and hereby realizing the product code scheme for RLL parity-check coding.

The even segments in the first additional row 43, namely the merging segments 49, do not contain any coded information, but are used for concatenation purposes, in particular for prohibiting violation of the (d,k) constraints and for DC-control. Similarly, the odd segments of the second additional row 44, namely merging segments 50, do not contain any coded information, but are used for concatenation purposes, e.g. prohibiting violation of the (d,k) constraints and for DC-control (in the second row).

One practical advantage of the zig-zag scheme is the fact, that the RLL coding can be done in a row-after-row fashion, which makes this scheme suitable for DC-control on the column parity-check rows via proper selection of the channel words in the merging segments 49.

The vertical or column-based parity-check coding for a single column is described next. The first (ODD) column is $N_1$ bits wide. For these $N_1$ bits, there are in general $N_{dk}(N_1)$ possible sequences that are consistent with the (d,k) constraints. For simplicity it is assumed that $N_1 \leq k$, so that only the d-constraint has to be considered for the number of possible sequences, which is then $q_1 = N_d(N_1)$.

Similarly, for the second (EVEN) column, that is $N_2$ bits wide, it is assumed that $N_2 \leq k$, so that the number of possible sequences with width $N_2$ channel bits is $q_2 = N_d(N_2)$.

The following table 1 shows the number $q_1 = N_d(N_1)$ of possible sequences as a function of width $N_1$ bits for minimum runlength constraint d=1.

TABLE 1

| | | | N1 | | |
|---|---|---|---|---|---|
| | | 0 | 1 | 2 | 3 | 4 |
| possible sequences | by definition | 0 | 00 1 | 000 001 010 100 101 | 0000 1000 0100 0010 1010 0001 1001 0101 |
| $q_1 = N_d(N_1)$ | | 1 | 2 | 3 | 5 | 8 |

Number $q_1 = N_d(N_1)$ of possible sequences as a function of width $N_1$ bits for minimum runlength constraint d = 1

In more general the number $q_1 = N_d(N_1)$ of possible sequences of width $N_1$ bits is given according to table 2 with the minimum runlength constraint d as a parameter for d=1, ..., 5 and $N_1$=0, 1, 2, ..., 14.

TABLE 2

| | | | | | | | | $N_1$ | | | | | | | |
|---|---|---|---|---|---|---|---|---|---|---|---|---|---|---|---|
| d | 0 | 1 | 2 | 3 | 4 | 5 | 6 | 7 | 8 | 9 | 10 | 11 | 12 | 13 | 14 |
| 1 | 1 | 2 | 3 | 5 | 8 | 13 | 21 | 34 | 55 | 89 | 144 | 233 | 377 | 610 | 987 |
| 2 | 1 | 2 | 3 | 4 | 6 | 9 | 13 | 19 | 28 | 41 | 60 | 88 | 129 | 189 | 277 |
| 3 | 1 | 2 | 3 | 4 | 5 | 7 | 10 | 14 | 19 | 26 | 36 | 50 | 69 | 95 | 131 |
| 4 | 1 | 2 | 3 | 4 | 5 | 6 | 8 | 11 | 15 | 20 | 26 | 34 | 45 | 60 | 80 |
| 5 | 1 | 2 | 3 | 4 | 5 | 6 | 7 | 9 | 12 | 16 | 21 | 27 | 34 | 43 | 55 |

Number $q_1 = N_d(N_1)$ of possible sequences as a function of width $N_1$ bits for a minimum runlength constraint d as a parameter Similar values apply for the second (even) columns with $N_2$ bits width wherein the number of possible sequences is $q_2 = N_d(N_2)$, i.e. tables 1 and 2 can be used by replacing index "1" by index "2".

Via enumerative coding (cf. e.g. K. A. Schouhamer Immink, "Codes for Mass Data Storage Systems", Schannon Foundation Publishers, The Netherlands, 1999, Chap. 6) for each different sequence of length $N_1$, called word $W_j$ in row j, with its $N_1$(d,k)-bits denoted by $b_i^j$, a unique index $w_j$ is associated with $0 \leq w_j \leq q_1 - 1$, given by $$w_j = \sum_{i=0}^{N_1-1} b_i^j \cdot N_d(i) \quad (2)$$

The following table 3 illustrates the calculation of the unique index $w_j$ for the words $W_j$ for the example of a width $N_1$=4 bits and d=1.

TABLE 3

| $W_j$ | $w_j(W_j)$ |
|---|---|
| 0000 | $0 \cdot 1 + 0 \cdot 2 + 0 \cdot 3 + 0 \cdot 5 = 0$ |
| 1000 | $1 \cdot 1 + 0 \cdot 2 + 0 \cdot 3 + 0 \cdot 5 = 1$ |

TABLE 3-continued

| $W_j$ | $w_j(W_j)$ |
|---|---|
| 0100 | $0 \cdot 1 + 1 \cdot 2 + 0 \cdot 3 + 0 \cdot 5 = 2$ |
| 0010 | $0 \cdot 1 + 0 \cdot 2 + 1 \cdot 3 + 0 \cdot 5 = 3$ |
| 1010 | $1 \cdot 1 + 0 \cdot 2 + 1 \cdot 3 + 0 \cdot 5 = 4$ |
| 0001 | $0 \cdot 1 + 0 \cdot 2 + 0 \cdot 3 + 1 \cdot 5 = 5$ |
| 1001 | $1 \cdot 1 + 0 \cdot 2 + 0 \cdot 3 + 1 \cdot 5 = 6$ |
| 0101 | $0 \cdot 1 + 1 \cdot 2 + 0 \cdot 3 + 1 \cdot 5 = 7$ |

Word $W_j = (b_0^j, b_1^j, b_2^j, \ldots, b_{N_1-1}^j)$ in row j with $N_1$ bits $b_i^j$ having unique index $$w_j = \sum_{i=0}^{N_1-1} b_i^j \cdot N_d(i) \text{ for } N_1 = 4 \text{ bits,}$$

i.e. $W_j = (b_0^j, b_1^j, b_2^j, b_3^j)$ and $$w_j = \sum_{i=0}^{3} b_i^j \cdot N_d(i)$$

As there are M RLL rows 8 to 13, for the first (ODD) column a $N_1$ bits wide extra word (or segment, at the row-column intersection) for row M+1, namely the first column parity-check row 43 is generated, so that the following vertical or column-based parity-check condition (denoted by V, and being a number between 0 and $q_1$) is satisfied:

$$V = \text{Mod}\left[\sum_{j=1}^{M+1} w_j, q_1\right] = 0 \quad (3)$$

In this sense, the extra word is a column parity-check enabling channel word. A similar situation applies for the case of the second (EVEN) column, with a width of $N_2$ channel bits. Thus, a unique index $w_j$, with $0 \leq w_j \leq q_2 - 1$ for each word $W_j$ with a width of $N_2$ bits is given by:

$$w_j = \sum_{i=0}^{N_2-1} b_i^j \cdot N_d(i) \quad (4)$$

The vertical or column-based parity-check condition may be either calculated as for the above first (ODD) column as given by equation (3). Alternatively this vertical or column-based parity-check condition is calculated by computing the vertical parities over M+2 rows, yielding:

$$V = \text{Mod}\left[\sum_{j=1}^{M+2} w_j, q_2\right] = 0 \quad (5)$$

Assumed that an SBTSE has occurred in one of the segments or words $W_j$ of the considered (ODD or EVEN) column. Then three different situations have to be distinguished:

1. First Situation:

The transition shift of the SBTSE is completely internal within the corresponding segment. The transition shift does not involve any shifts over the segment boundaries. The transition can be either to the right ($i \rightarrow i+1$), or to the left ($i \rightarrow i-1$).

A shift-error to the right in a segment consisting of word $W_j$ (with width of $N_1$ bits) with the word index $w_j$ according to equation (2) may be illustrated as:

$$b_i^j b_{i+1}^j = 10 \Rightarrow b_i^{j\prime} b_{i+1}^{j\prime} = 01 \quad (6)$$

Such a shift-error results in a variation $\Delta w_j$ of the as-detected word index $w_j$ $$\Delta w_j = w_j' - w_j = N_d(i+1) - N_d(i) \quad (7)$$

and thus of the as-detected vertical parity-check value $$V_{as\text{-}detected} = \Delta w_j \neq 0 \quad (8)$$

Thus, the as-detected value of V becomes:

$$V_{as\text{-}detected} = N_d(i \pm 1) - N_d(i) \quad (9)$$

wherein $N_d(i-1)$, $N_d(i)$, $N_d(i+1)$ are determined e.g. according to table 1 or 2, and where the "+" refers to a transition-to-the-right, and the "−" refers to a transition-to-the-left.

Thus, a SBTSE is determined internal of such a segment, namely a) a transition-shift error is determined from bit position i to the right to bit position i+1, if the detected column-based parity-check constraint is detected as $$V_{as\text{-}detected} = N_d(i+1) - N_d(i) \quad (10)$$

and b) a transition-shift error is determined from bit position i to the left to bit position i−1, if the detected column-based parity-check constraint is detected as $$V_{as\text{-}detected} = N_d(i-1) - N_d(i) \quad (11)$$

Figure 8:
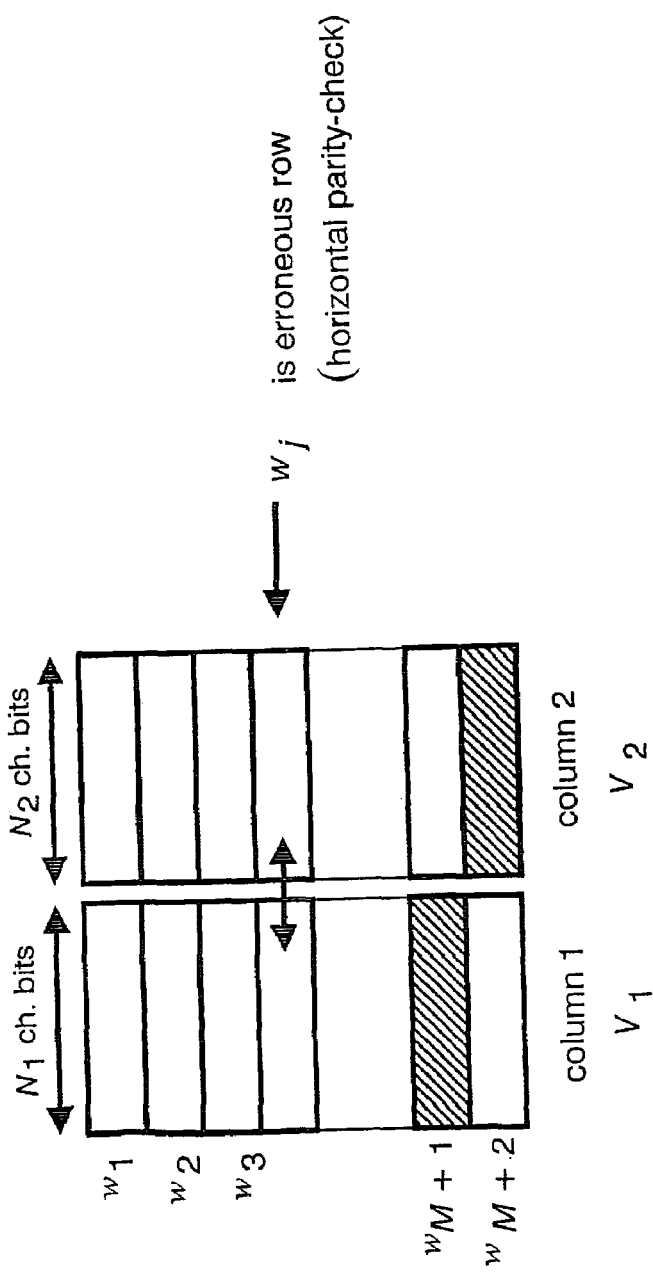
FIG. 8 shows the situation of a SBTSE crossing the boundaries of two adjacent segments for the case of the embodiment according to FIG. 7.

2. Second Situation:

A second situation occurs, if the transition shift crosses the left boundary of the segment as being-indicated in FIG. 8 for column 2. The original transition-bit can be either in the present column (column 2) or in the previous column (column 1). For the V-criterion of the present column, this leads to as-detected values $V = \mp N_d(0)$, and for the previous column, this leads to as-detected values $V = \pm N_d(N_1-1)$ assuming that the previous column has segments with a width of $N_1$ bits.

Thus, a SBTSE is determined crossing the left boundary of such a segment, namely a) a transition-shift error is determined from the last bit position of the previous segment to the first bit position of the present segment, if the detected column-based parity-check constraint is detected for the present column as $$V_{as\text{-}detected,\,present} = +N_d(0) \quad (12)$$

and if the detected column-based parity-check constraint is detected for the previous column as $$V_{as\text{-}detected,\,previous} = -N_d(N_{1,2}-1) \quad (13)$$

where $N_{1,2}$ is the number of bits within a segment of the left-hand side (or previous) column (in FIG. 8, this number has been chosen to be equal to $N_1$), or b) a transition-shift error is determined from the first bit position of the present segment to the last bit position of the previous segment, if the detected column-based parity-check constraint is detected for the present column as $$V_{as\text{-}detected,\,present} = -N_d(0) \quad (14)$$

and if the detected column-based parity-check constraint is detected for the previous column as $$V_{as\text{-}detected,\,previous} = +N_d(N_{1,2}-1) \quad (15)$$

3. Third Situation:

A third situation occurs if the transition shift crosses the right boundary of the segment. This can be shown to be a straightforward extension of the second situation, but for the sake of completeness this situation is also described in full detail. Then, the original transition-bit can be either in the present column, or in the subsequent column. For the V-criterion of the present column, this leads to as-detected values $V = \mp N_d(N_2-1)$, and for the subsequent column this leads to as-detected values $V = \pm N_d(0)$, assuming that the present column has segments with a width of $N_2$ bits.

Thus, a SBTSE is determined crossing the right boundary of a segment, namely a) a transition-shift error is determined from the last bit position of the present segment to the first bit position of the subsequent segment, if the detected column-based parity-check constraint is detected for the present column as $$V_{as\text{-}detected,\,present} = -N_d(N_{1,2}-1) \quad (16)$$

where $N_{1,2}$ is the number of bits within a segment of the left-hand side (or present) column, considering the subsequent column to be equal to the right-hand-side column, and if the detected column-based parity-check constraint is detected for the subsequent column as $$V_{as\text{-}detected,\,subsequent} = +N_d(0) \quad (17)$$

or b) a transition-shift error is determined from the first bit position of the subsequent segment to the last bit position of the present segment, if the detected column-based parity-check constraint is detected for the present column as $$V_{as\text{-}detected,\,present} = +N_d(N_{1,2}-1) \quad (18)$$

and if the detected column-based parity-check constraint is detected for the subsequent column as $$V_{as\text{-}detected,\,subsequent} = -N_d(0) \quad (19)$$

The error correction for the case of an independent column error is described next.

It is assumed that an internal error in a column has occurred as described above with reference to the first situation. The previous and subsequent column may also be independently in-error, but the combination of the, error-values may not be within the second or third situations, namely for non-internal errors crossing the boundaries of a segment (which have been dealt with extensively in the previous section). By evaluation of the V parity-check criterion, for non-zero values of the as-detected V, it can be detected that an error has occurred in the column. By checking for which row an erroneous horizontal or row-based parity-check was detected, the segment consisting of word $W_j$ can be located in which the error has occurred.

After error location at the proper row-column intersection of the row identified to be erroneous by the row-parity-check decoding, and of the column identified to be erroneous by the column-parity-check decoding, we need to perform error-correction. There is more than a single procedure for error-correction.

As a first embodiment, we describe a procedure to pinpoint the erroneous 1-bit that has been shifted. In all embodiments, it is assumed that random errors which lead to violations of the d constraint have already been corrected. Such correction procedure in the bit-detection is known as run-detector or runlength-push back detector, as described in G. J. van den Enden, "Transmission System and Recording System having a Simplified Symbol Detector", European Pat. No. EP0885499, issued Dec. 23, 1998; and in T. Nakagawa, H. Ino and Y. Shimpuku, "A Simple Detection Method for RLL Codes (Run Detector)", IEEE Trans. Magn., Vol. 33, no. 5, pp. 3263-3264, September 1997. This implies that the channel words in all segments are consistent with the d constraint, since all violations have been removed.

If more than a single "1"-bit occurs in the word, it is still possible to pinpoint the erroneous transition, since the as-detected V-values are representative for the "1"-bit that is shifted. If $V<N_d(N_1)/2$, then a right shift has occurred. In case $V>N_d(N_1)/2$, a left shift has occurred. As an example the case is considered for d=2, k=10, and $N_1$=k=10, for which $q_1=N_d(N_1)$=60.

Table 4 shows the as-detected vertical parity-check criterion $V_{as\text{-}detected}$ as a function of the position i of a shifted transition for a right-shift error and d=2, k=10, N=10, $N_{d=2}(N=10)$=60

TABLE 4

| | i | | | | | | | | |
|---|---|---|---|---|---|---|---|---|---|
| | 0 | 1 | 2 | 3 | 4 | 5 | 6 | 7 | 8 |
| $V_{as\text{-}detected}$ | +1 | +1 | +1 | +2 | +3 | +4 | +6 | +9 | +13 |

Correspondingly, the as-detected vertical parity-check criterion $V_{as\text{-}detected}$ can be obtained for a left-shift error according to table 5 as follows:

TABLE 5

| | i | | | | | | | | |
|---|---|---|---|---|---|---|---|---|---|
| | 1 | 2 | 3 | 4 | 5 | 6 | 7 | 8 | 9 |
| $V_{as\text{-}detected}$ | −1 | −1 | −1 | −2 | −3 | −4 | −6 | −9 | −13 |

The values according to tables 4 and 5 are obtained from table 2 for the case of d=2 by computing the difference values between two neighboring values within line d=2.

Thus, the as-detected V values for right-shifting SBTSE errors and for the left-shifting SBTSE errors are given by:

$$V_{as\text{-}detected} = \pm 1, \pm 1, \pm 1, \pm 2, \pm 3, \pm 4, \pm 6, \pm 9, \pm 13 \quad (20)$$

At a first glance, it seems that the first three cases ($V_{as\text{-}detected} = \pm 1, \pm 1, \pm 1$) cannot be distinguished, because they lead to same V-values. However, for right-shifting SBTSE, the first three "+1"'s according to equation 20, for instance, indicate, that a transition in the first four bits (except the first bit) should be back-shifted to the left. Hence the detected bit-patterns are (with | indicating the word boundary at the left of a segment):

|0100 - - - ,

|0101 - - - (with the second bit to be shifted back to the left for correction),

|0010 - - - (with the third bit to be shifted back to the left for correction), and

|0001 - - - (with the fourth bit to be shifted back to the left for correction).

These four cases lead un-ambiguously to the following corrected words (for the case of d=2), respectively:

|1000 - - - ,

|1001 - - - ,

|0100 - - - ,

|0010 - - - .

Thus, no ambiguity is left about which transition is to be corrected in the word at the crossing point of an erroneous row and an erroneous column (error-location at row-column intersection). Note that for the practical case considered here (d=2), the second situation does not occur in case the run-detector as described above has removed all d=2 violations.

The correction procedure, however, can be made more general. This is a second embodiment for error-correction. It is assumed that by using the row-based parity-check, a segment consisting of the word $W_j$ has been located to be the erroneous segment in the erroneous column. Further, it is assumed that the original word index was $w_j$, and that the as-detected word index is $w_j'$. Then, the as-detected value of the vertical or row-based parity-check is:

$$V_{as\text{-}detected} = \Delta w_j = w_j' - w_j \quad (21)$$

and the corrected index for this segment is given by:

$$w_j = w_j' - V_{as\text{-}detected} \quad (22)$$

Preferably the width of the columns (or segments) is made as narrow as possible, since this allows for a more dense two-dimensional grid to carry out the two-dimensional error-location and correction. A more dense grid enables a better error-correction performance of the product code scheme for RLL parity-check coding. The minimum width of a column is given by d channel bits, which is the minimum number of bits needed as merging bits between any two other segments or words. The maximum width is given by k. Thus, the widths $N_1$, $N_2$ are given by $$d \leq N_{<1,2>} \leq k \quad (23)$$

For each column either the top or the bottom part can be used as a merging segment. However, as the location of the column parity-check rows 43, 44 is also possible at any position within the group of M RLL rows 8 to 13, the merging segments 49, 50 may also be located within a column.

The error correction for the case of dependent column errors is described next. As being described above with reference to the second and third situations in case of a transition shift crossing the boundary of a segment, two neighboring columns are detected to be erroneous and the column parity-check criterion V of the two columns correspond either to the above second and third situation. Such cases are detectable straight forward, because they lead to the above described typical error patterns with the above mentioned V values. Therefore, the corresponding bits at the boundaries of the detected columns can be shifted correspondingly.

Figure 9:
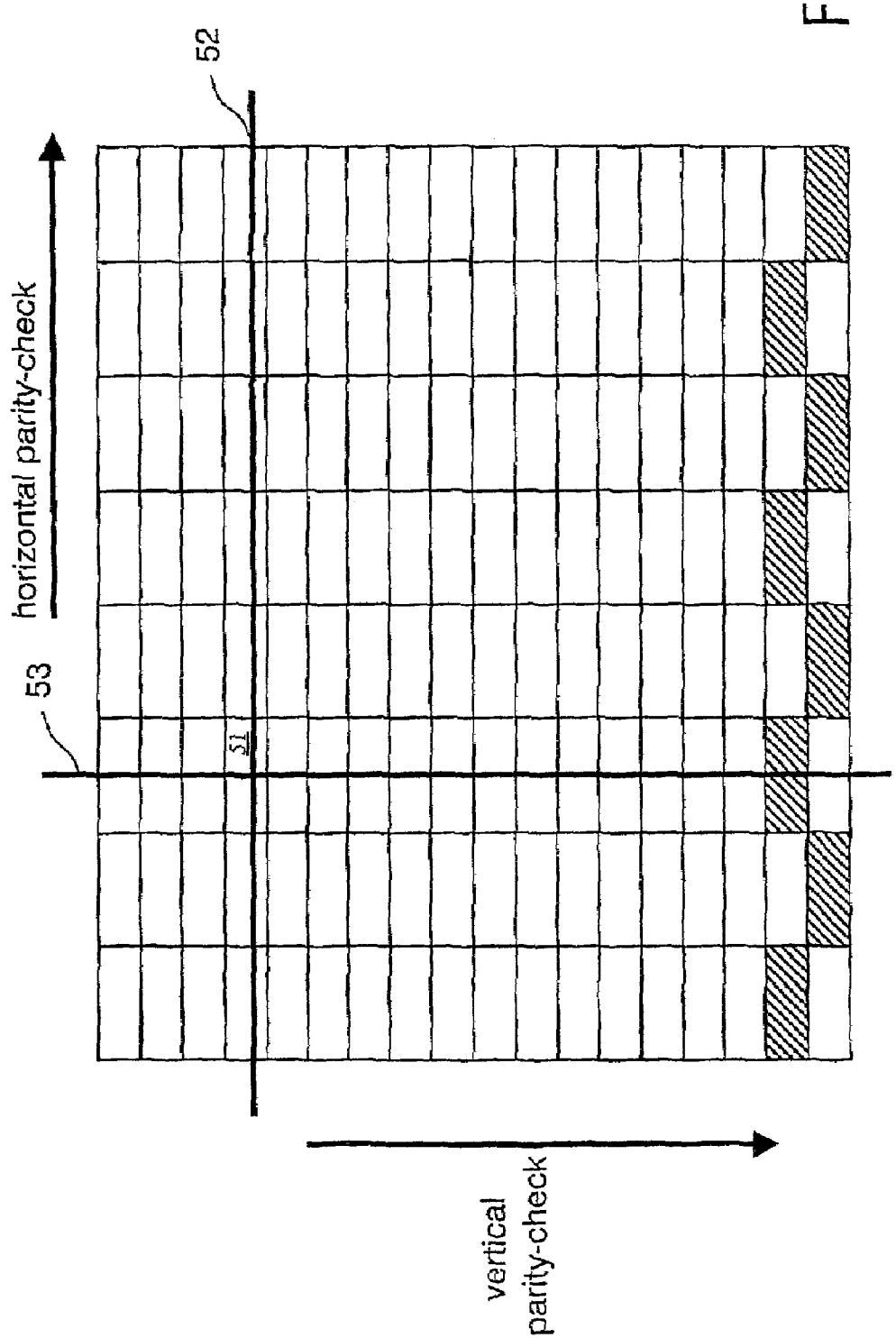
FIG. 9 shows a single SBTSE event occurring in the embodiment according to FIG. 7.

FIG. 9 shows a single SBTSE event for a coding scheme according to FIG. 7. A single SBTSE has occurred in an erroneous segment 51 being located in an erroneous row 52 and in an erroneous column 53. The erroneous row 52 is determined by the corresponding row parity-check criterion. The erroneous column 53 is determined by the corresponding column parity-check criterion. Thus, an error event according to the above described first situation occurred. This error event is corrected as described above with reference to this first situation. It is noted, that no channel side-information has to be used for detection and/or correction of the corresponding erroneous segment 51 and in particular the corresponding erroneous bit in this segment 51.

Figure 10:
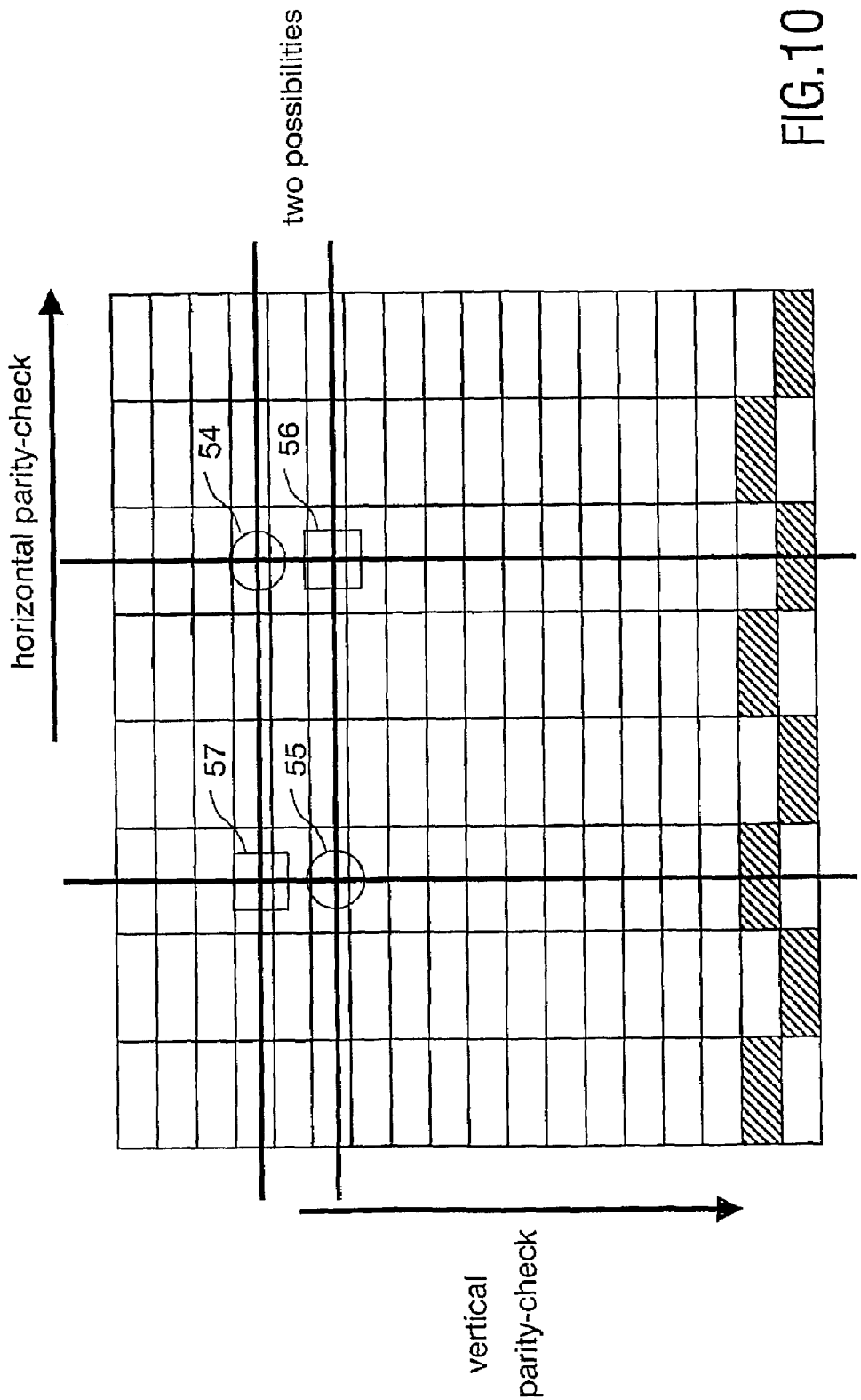
FIG. 10 shows a double SBTSE event in the embodiment according to FIG. 7.

FIG. 10 shows the case for two independent SBTSEs 54, 55. As described above with reference to FIG. 4 the two errors 54, 55 cannot be distinguished from the situation that errors would have appeared in the segments relating to crossing points 56, 57. In order to select the correct solution, channel side-information is used again. It is noted, that channel side-information is only needed for the transitions indicated by the segments related to the crossing points 56, 57 and the segments related to the crossing points relating to SBTSEs 54, 55. Thus, only a small amount of channel side-information is used.

In conclusion the invention proposes different schemes for incorporating a product code scheme consisting of parity-check codes for a (d, k) channel bitstream. These different schemes are illustrated with reference to FIGS. 11 to 16. In each of these FIGS. 11 to 16 a group of M RLL rows (each representing an RLL parity-check code-word with a given parity-check constraint) 45 is followed by a group of K of column parity-check rows 46.

Figure 11:
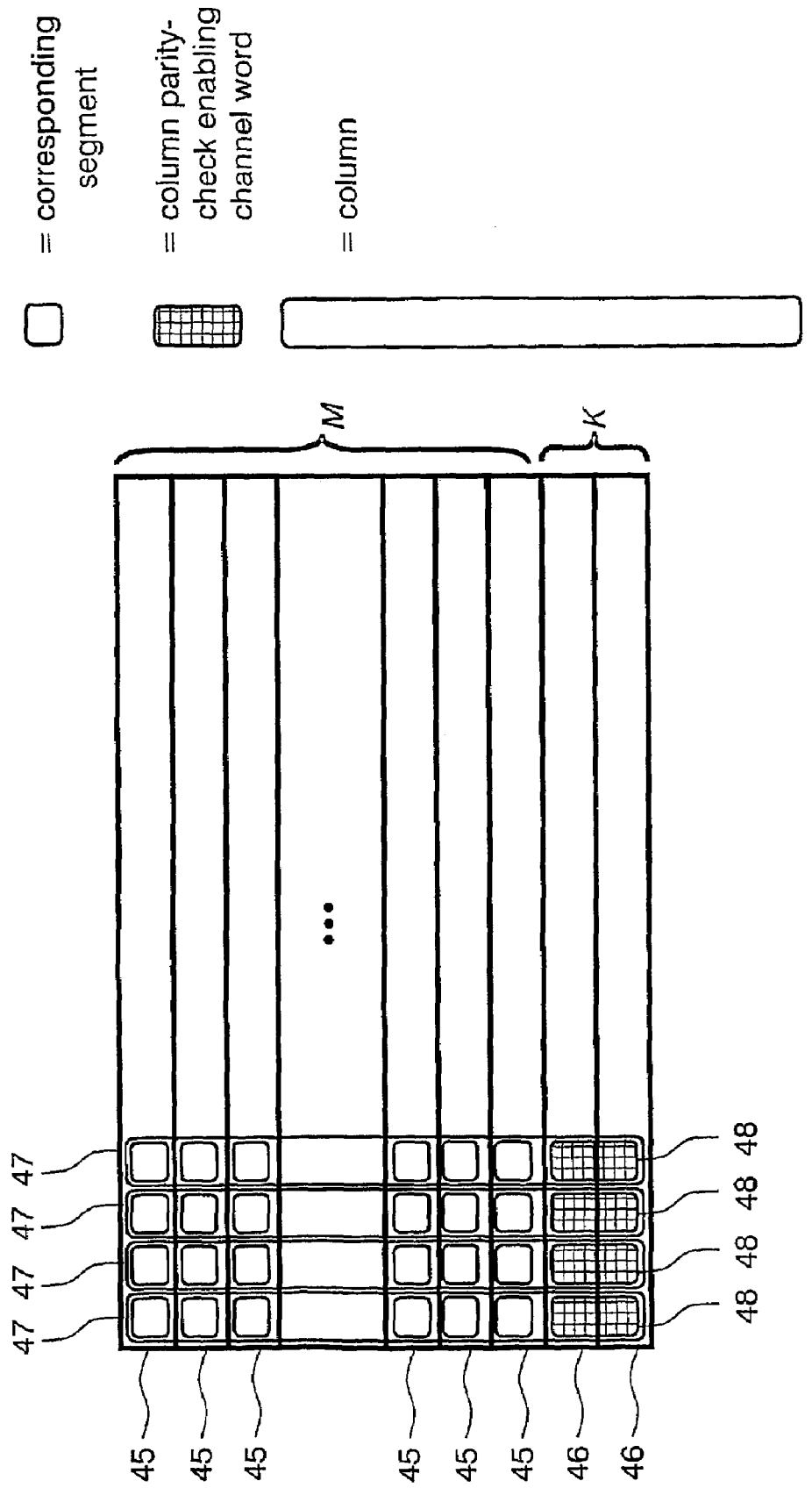
FIG. 11 shows the principle arrangement of vertical columns for the embodiment according to FIG. 5.

In FIG. 11 columns 47 are constituted at every bit position of the (d, k) channel bitstream. The widths of these columns 47 is therefore one bit. Each column 47 comprises one column parity-check enabling channel (RLL) word or segment 48 at it's bottom end and a number of M corresponding segments in the M RLL rows.

Preferably at the end of each row, but possibly everywhere else in a row, a row parity-check enabling channel (RLL) word (not shown) is provided for realizing a row-based parity-check constraint, hereby constituting a row parity-check codeword.

Figure 12:
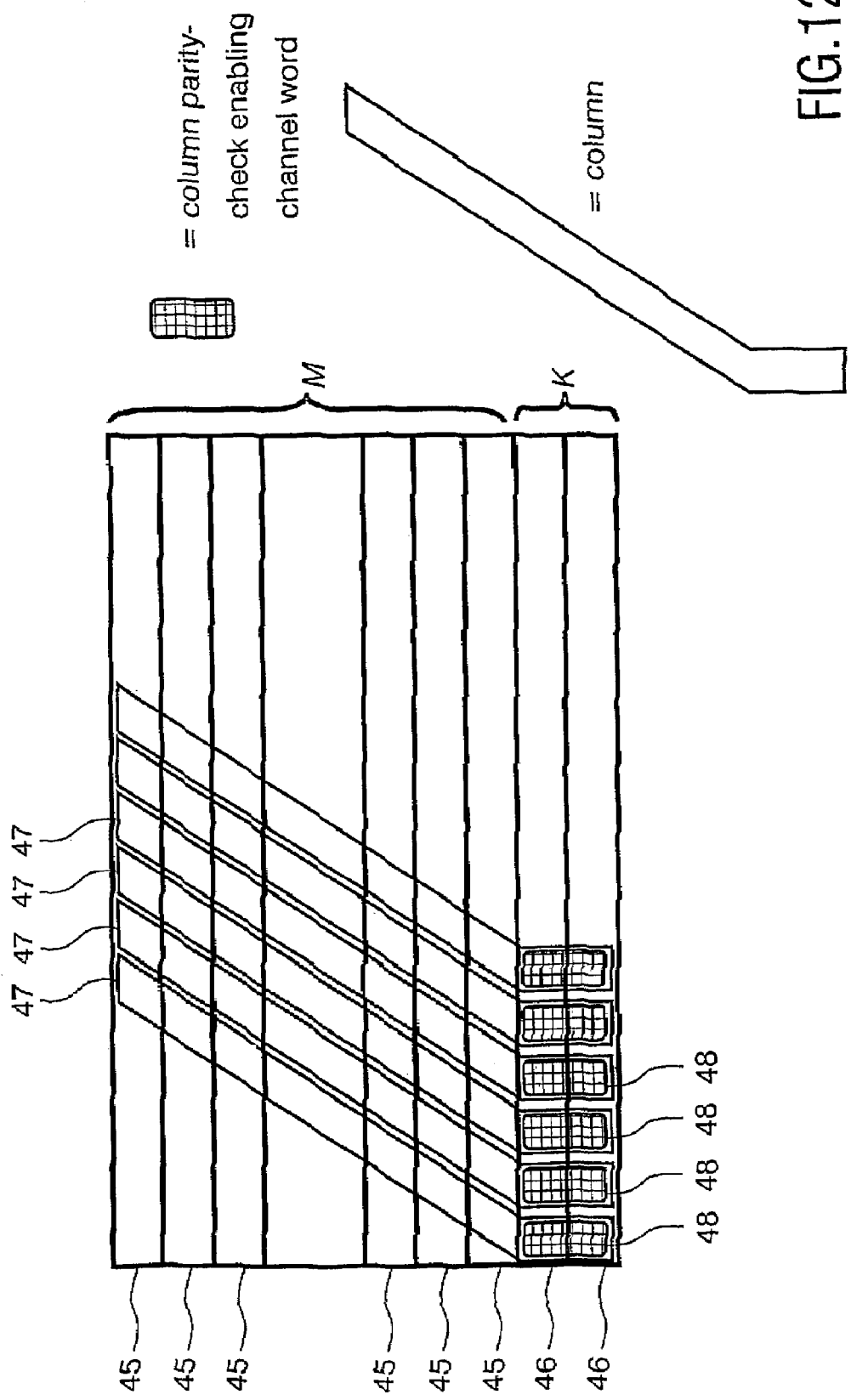
FIG. 12 shows the principle arrangement for transversal columns for the embodiment according to FIG. 5.

FIG. 12 shows the same code as shown in FIG. 11, however, the columns 47 are not arranged vertically, but transversely, which is possible as well.

Figure 13:
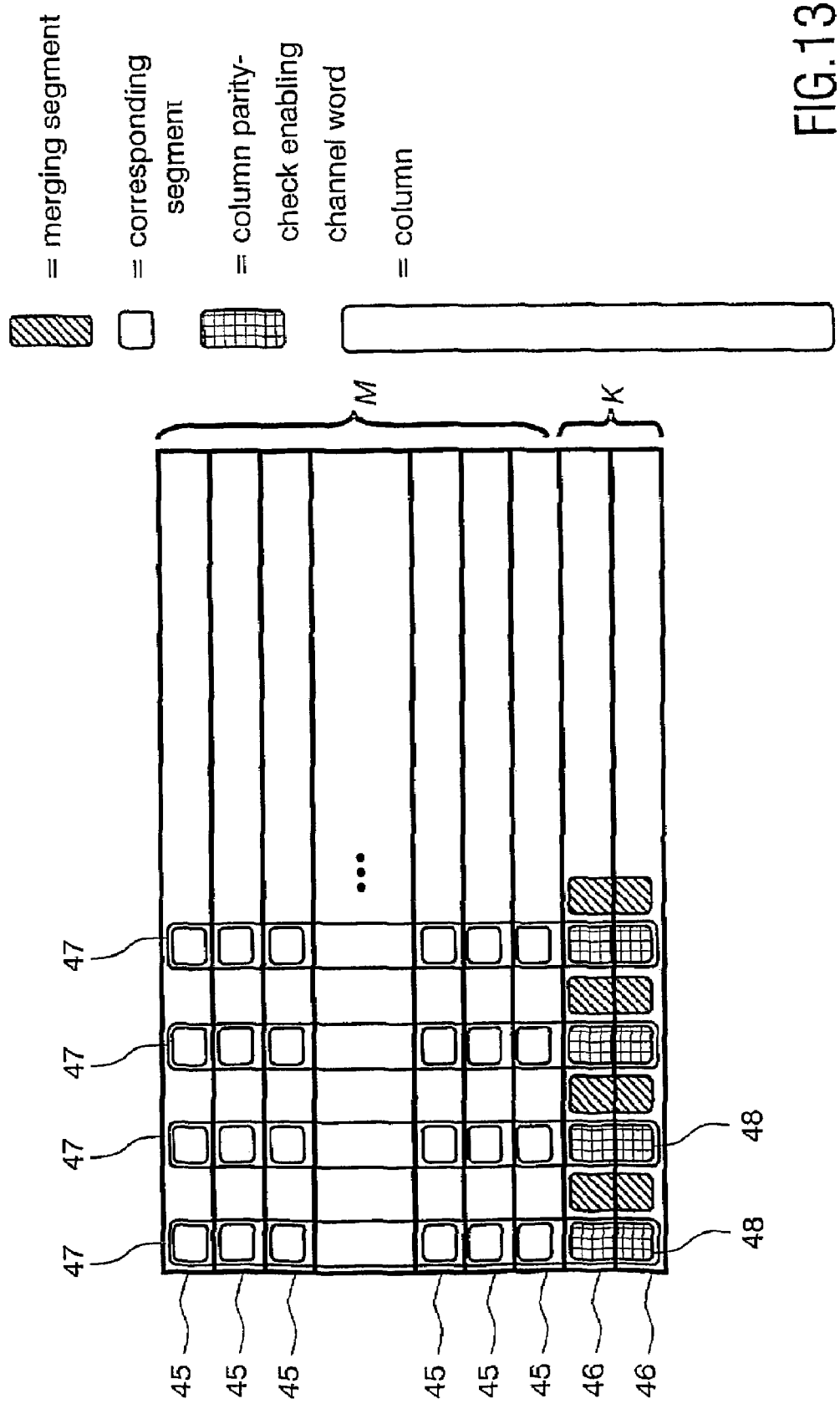
FIG. 13 shows the principle arrangement for vertical columns for the embodiment according to FIG. 6.

We focus now on the special case that a column is only one-bit wide. This implementation really differs from the zig-zag implementation, where the width of the columns should not be smaller than d. FIG. 13 shows a code quite similar to FIG. 11, however, every second column is omitted for parity checking, i.e. the (d, k) channel bits of these omitted columns are not column-based parity-check encoded. Thus, in the column parity-check rows 46 only every second segment is used as a column parity-check enabling channel word 48. Therefore, column parity-check enabling channel word 48 are provided at every second bit (or column) position only.

Figure 14:
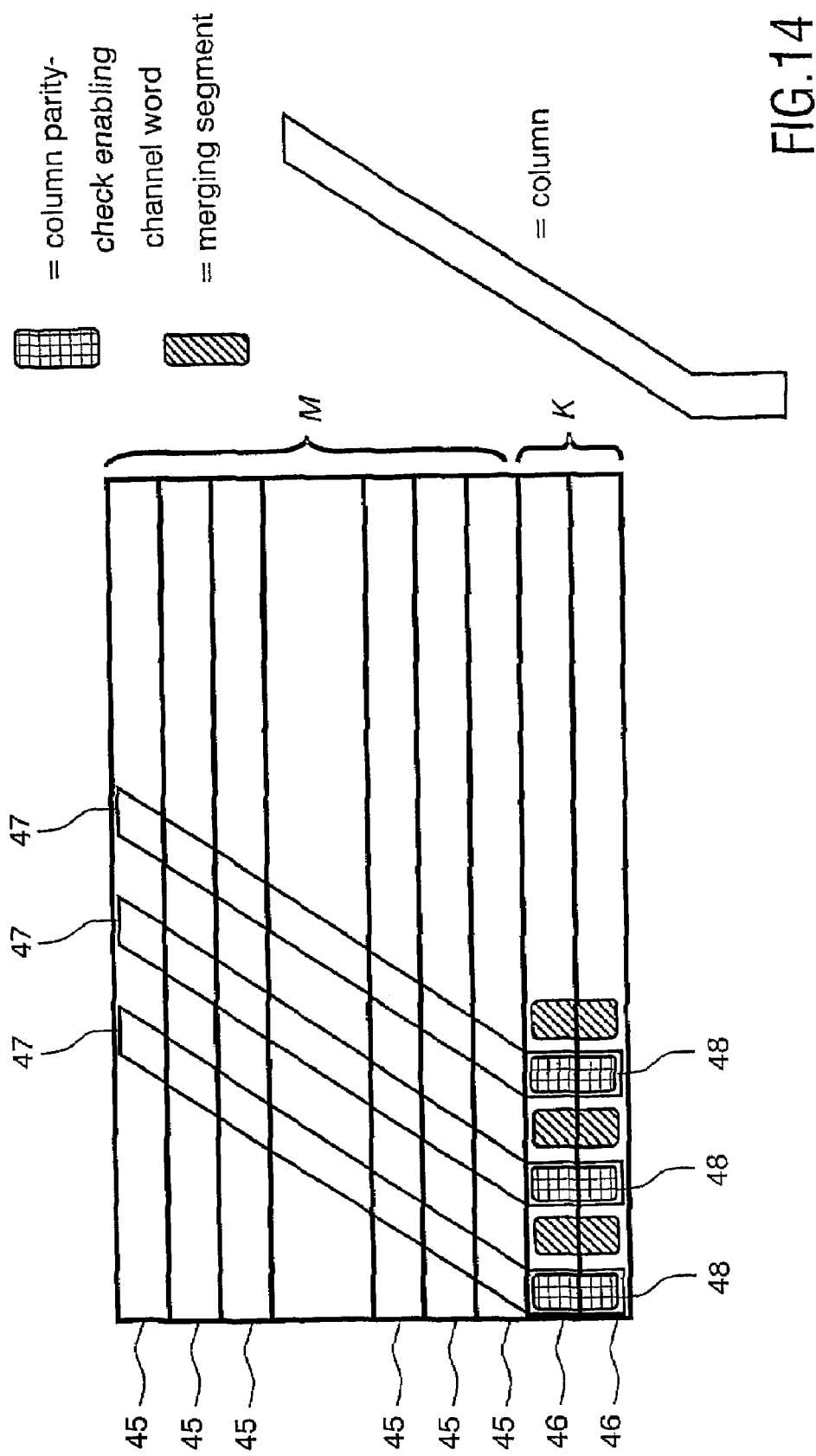
FIG. 14 shows the principle arrangement of transversal columns for the embodiment according to FIG. 6.

FIG. 14 shows a code corresponding to the code of FIG. 13, however, the columns 47 not being vertically oriented, but being transversely oriented.

Figure 15:
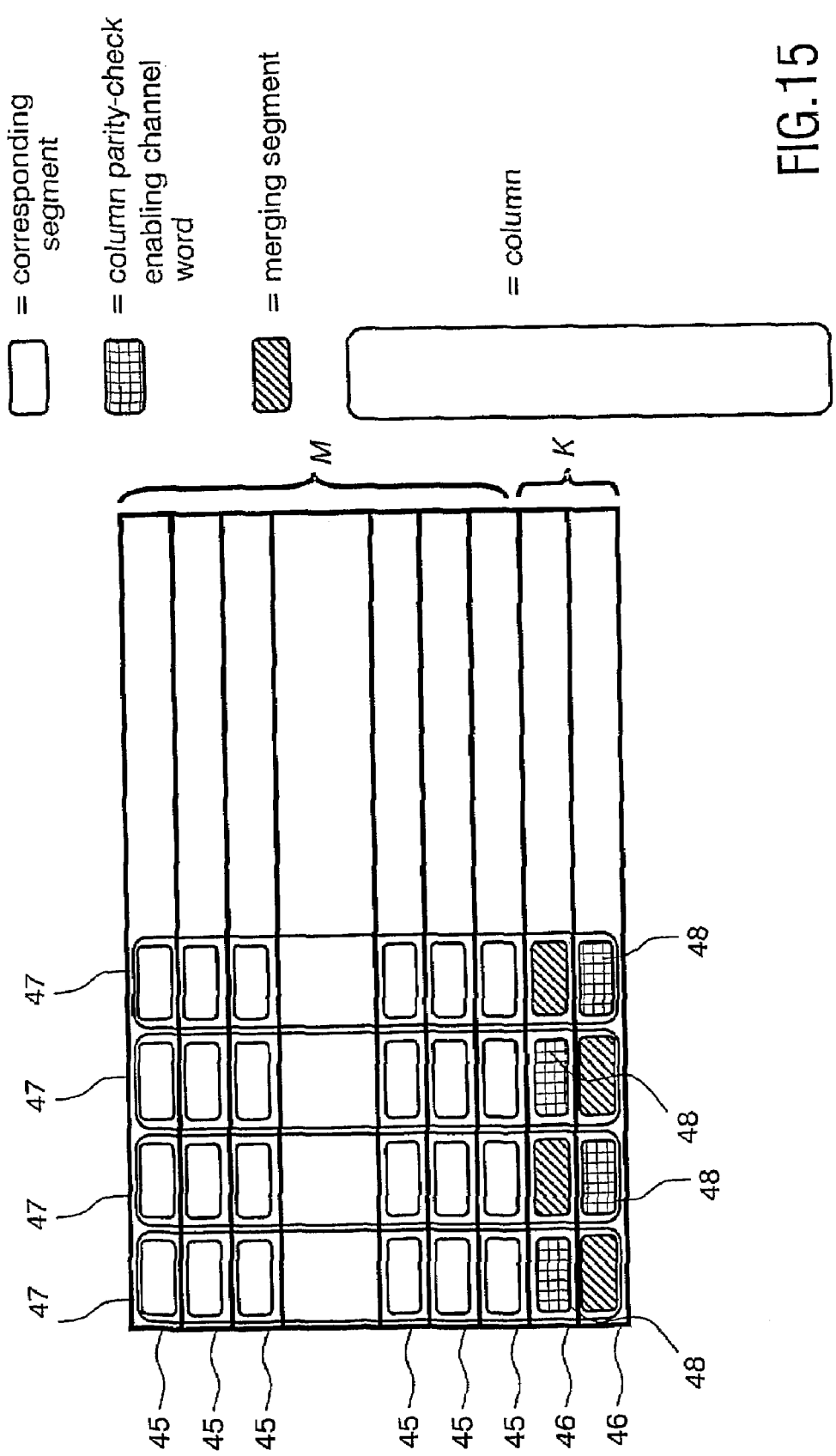
FIG. 15 shows the principle arrangement for vertical columns for the embodiment according to FIG. 7.

FIG. 15 is a simplified illustration of the code shown in FIG. 7 (giving a basis for comparing with the code according to FIG. 16), wherein the width of the columns 47 is larger than one bit (at minimum d bits) and wherein the number K of column parity-check rows 46 is two. Thus, each column 47 comprises a column parity-check enabling channel word 48 with a corresponding width as well as corresponding segments of the same width in the M RLL rows 45. However, in each column parity-check row 46 only every second segment is used as a column parity-check enabling channel words 48, in a row-wise interleaved way, wherein the segments in between such column parity-check enabling channel words 48 are used as merging segments.

Again, preferably at the end of each RLL row 45 row parity-check enabling channel words (not shown) are provided for realizing a row-based parity-check constraint, hereby constituting a row parity-check codeword.

Figure 16:
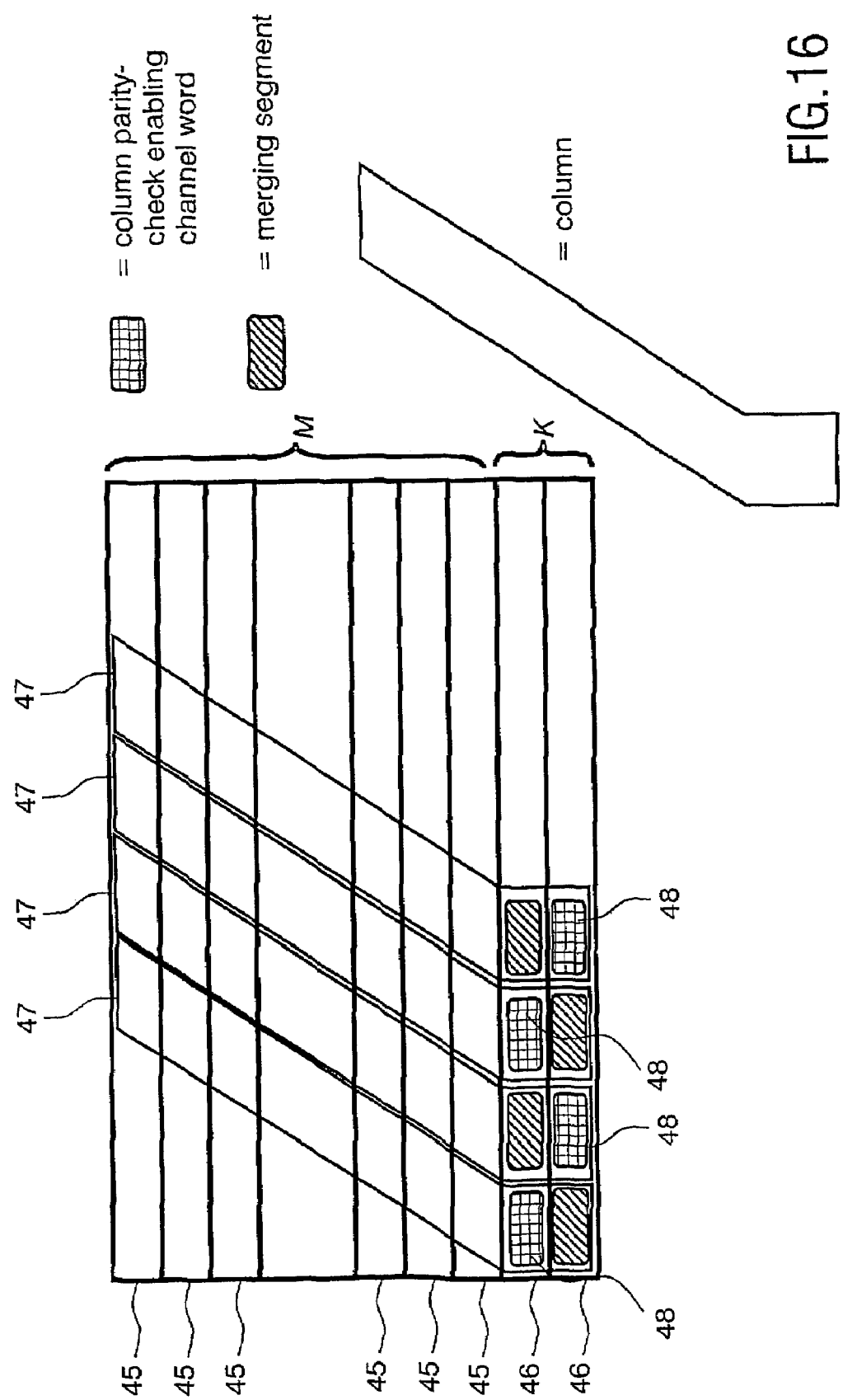
FIG. 16 shows the principle arrangement of transversal columns for the embodiment according to FIG. 7.

FIG. 16 shows almost the same code as FIG. 15, however, the columns 47 being arranged transversely instead of vertically.

It is noted, that in the cases of FIG. 13 to 16 only about half of the segments within the column parity-check rows 46 are used as column parity-check enabling channel words, whereas the other segments are used as merging segments.

Summarized, the invention improves the random-error performance of the channel, preferably being embodied as a optical, magnetic, or magneto-optical storage medium by using a parity-check RLL code combined with a product code, thus reducing the need to use a channel side-information for the purpose of error-location considerably.

Note that in the above description, we have made the convention that "rows" correspond with the direction along which the RLL code is realized. However, the invention allows also to exchange rows for columns and vice versa, thereby, still realizing the same idea.

The invention claimed is:

1. A signal embedded in a carrier, the signal comprising a runlength limited (RLL) encoded binary d, k channel bitstream, wherein parameter d defines a minimum number and parameter k defines a maximum number of zeroes between any two ones of said bitstream or vice versa, comprising:

RLL rows including a number of sections of respectively N successive RLL channel bits, each RLL row representing a parity-check code-word, called row parity-check code-word, in which a row-based parity-check constraint for said RLL row has been realized;

wherein column parity-check rows having K sections of respectively N successive channel bits are located at predetermined positions of a group of M RLL rows, K, N and M being integer values, said column parity-check rows comprising a plurality of column parity-check enabling channel words, wherein each of said column parity-check enabling channel words realizes a column-based parity-check constraint for all corresponding segments of at least said M RLL rows of said group that correspond to a specific column parity-check enabling channel word, for outputting a column parity-check codeword.

2. The signal according to claim 1, wherein the number K of column parity-check rows is at least 2.

3. The signal according to claim 1, wherein each one of said row parity-check code-words comprises a row parity-check enabling channel word being appended to RLL encoded user data without itself containing user data.

4. The signal according to claim 1, wherein each one of said row parity-check code-words comprises a row parity-check enabling channel word being encoded user data.

5. The signal according to claim 1, wherein each of said row parity-check code-words comprises a parity-check bit $p_{2H}$ realizing the row-based parity-check constraint $$p_{2H} = \mathrm{Mod}\left[\sum_{i=0}^{N-1} i \cdot b_i, 2\right]$$

which is at an encoder set to a predetermined value, known at a decoder, being either set to 0 or to 1, with $b_i$ being successive bits of said d,k channel bitstream of an RLL row.

6. The signal according to claim 1, wherein said corresponding segments of RLL rows being respectively a certain bit at a predetermined position of each of said RLL rows and a respective single-bit wide column parity-check enabling channel word or words is or are located at the same position of each of said K column parity-check rows.

7. The signal according to claim 6, wherein the number K of column parity-check rows is an integer value with $K \geq 1/R$, with R being the code rate of the RLL code with RLL constraints d and k.

8. The signal according to claim 7, wherein each of said single-bit wide column parity-check enabling channel words is an encoded symbol of a parity-check bit $p_{2V}$ realizing the column-based parity-check constraint $$p_{2V} = \mathrm{mod}\left[\sum_{i=0}^{M+K-1} b_i, 2\right]$$

which is at the encoder set to a predetermined value, known at the decoder, being either set to 0 or to 1, with $b_i$ being bits of the RLL rows of said group at a certain position, wherein the bits of said symbol are spread over said K column parity-check rows, one bit per row.

9. The signal according to claim 8, wherein said symbol is selected from a number of different symbols realizing said column-based parity-check constraint p2V in order to realize the d,k constraints of the RLL code within said column parity-check rows as well.

10. The signal according to claim 6, wherein said single-bit wide column parity-check enabling channel words are located at each channel bit position of a column parity-check row, hereby constituting at every bit-wide column a column parity-check codeword.

11. The signal according to claim 6, wherein said single-bit wide column parity-check enabling channel words are located at every second channel bit position only, constituting at every second bit-wide column a column parity-check codeword.

12. The signal according to claim 11, wherein channel bits between said second bit positions are used as merging bits in order to realize said d,k constraints of said RLL code and/or any desired spectral property of the code like DC-control.

13. The signal according to claim 1, wherein said predetermined position of a row parity-check enabling channel word is at the end of an RLL row.

14. The signal according to claim 1, wherein said K column parity-check rows are arranged successively.

15. The signal according to claim 1, wherein said M RLL rows are arranged successively.

16. The signal according to claim 1, wherein said predetermined position of said K column parity-check rows is at the end of said group.

17. The signal according to claim 1, wherein said predetermined position of said K column parity-check rows is in front of said group.

18. The signal according to claim 1, wherein said predetermined position of said K column parity-check rows is within said group.

19. The signal according to claim 1, wherein the number K of column parity-check rows is two, each of said column parity-check rows is divided into segments of at least two types, and in the case of two types, of more than one successive channel bits of alternating segment width $N_1$ or $N_2$, $N_1$ and $N_2$ being integer values, $N_1$ being the width of the first column parity-check segment and $N_2$ being the width of the second parity-check segment, wherein in each column parity-check row only every second segment is a column parity-check enabling channel word, and wherein only one of both column parity-check rows starts with a column parity-check enabling channel word, whereas in the other column parity-check row the first column parity-check enabling channel word is at the second segment position.

20. The signal according to claim 19, wherein within each column parity-check row merging segments in front of or behind a column parity-check enabling channel word do not contain any user data, but are designed such to realize said d,k constraints of said RLL code and/or any desired spectral property of the code like DC-control.

21. The signal according to claim 19, wherein in the first one of both column parity-check rows the parity-check information of each column parity-check enabling channel word realizes said parity-check constraint only for said column parity-check enabling channel word in addition to said corresponding segments of said M RLL rows of said group.

22. The signal according to claim 21, wherein in the second one of both column parity-check rows the parity-check information of each column parity-check enabling channel word realizes said parity-check constraint only for said column parity-check enabling channel word in addition to said corresponding segments of said M RLL rows of said group.

23. The signal according to claim 22, wherein said parity-check constraint is $$V = \text{Mod}\left[\sum_{j=1}^{M+2} w_j, q_1\right]$$

being set to a predetermined value at the encoder, known at the decoder, and is preferably set to 0, wherein j is a unique index associated with each RLL row for $1 \leq j \leq M$ and an index associated with the actual column parity-check row for j=M+1, and wherein $w_j$ is a unique index associated with each word $w_j$ which defines one of a number of possible d,k constrained sequences of said segment width ($N_1$, $N_2$), wherein such a word $w_j$ is comprised in each corresponding segment.

24. The signal according to claim 23, wherein said unique index $w_j$ is $$w_j = \sum_{i=0}^{N_{1,2}-1} b_i^j \cdot N_d(i)$$

wherein $b_i^j$ denotes bit number i of word $w_j$ in row j and wherein $N_d(i)$ is the number of possible d,k constrained sequences of length i.

25. The signal according to claim 21, wherein in the second one of both column parity-check rows the parity-check information of each column parity-check enabling channel word realizes said parity-check constraint for said column parity-check enabling channel word as well as the corresponding merging segment of said first column parity-check row in addition to said corresponding segment of said M RLL rows of said group.

26. The signal according to claim 25, wherein said column based parity-check constraint is $$V = \text{Mod}\left[\sum_{j=1}^{M+2} w_j, q_1\right]$$

being set to a predetermined value at the encoder, known at the decoder, and is preferably set to 0, wherein j is a unique index associated with each RLL row for $1 \leq j \leq M$ and with each column parity-check row for j=M+1, M+2, and wherein $w_j$ is a unique index associated with each word $W_j$ which defines one of the a number of possible d,k constrained sequences of said segment width ($N_1$, $N_2$), wherein such a word $W_j$ is comprised in each corresponding segment.

27. The signal according to claim 26, wherein said unique index $w_j$ is $$w_j = \sum_{i=0}^{N_{1,2}-1} b_i^j \cdot N_d(i)$$

wherein $b_i^j$ denotes bit number i of word $w_j$ in row j and wherein $N_d(i)$ is the number of possible d,k constrained sequences of length i.

28. The signal according to claim 21, wherein said parity-check constraint is $$V = \text{Mod}\left[\sum_{j=1}^{M+1} w_j, q_1\right]$$

being set to a predetermined value at the encoder, known at the decoder, and is preferably set to 0, wherein j is a unique index associated with each RLL row for $1 \leq j \leq M$ and an index associated with the actual column parity-check row for j=M+1, and wherein $w_j$ is a unique index associated with each word $W_j$ which defines one of a number of possible d,k constrained sequences of said segment width ($N_1$, $N_2$), wherein such a word $W_j$ is comprised in each corresponding segment.

29. The signal according to claim 28, wherein said unique index $w_j$ is $$w_j = \sum_{i=0}^{N_{1,2}-1} b_i^j \cdot N_d(i)$$

wherein $b_i^j$ denotes bit number i of word $W_j$ in row j and wherein $N_d(i)$ is the number of possible d,k constrained sequences of length i.

30. The signal according to claim 19, wherein said segment or channel word widths $N_1$ and $N_2$ are in the range of $d \leq N_{1,2} \leq k$.

31. The signal according to claim 1, further comprising a waveform said d,k channel bitstream, wherein said waveform transitions between two states (land, pit) whenever a one occurs in said d,k channel bitstream and keeps its actual state whenever a zero occurs in said d,k channel bitstream or vice versa.

32. A processor readable storage medium storing a signal according to any one of claims 1 to 31.

33. The storage medium according to claim 32, wherein said storage medium is a recorded optical, magnetic, or magneto-optical disc or recoded magnetic tape.

34. The method for decoding a signal according to claim 1, comprising the acts of:
checking for each RLL row a row-based parity-check constraint,
checking for each column parity-check segment of said column parity-check rows a column-based parity-check constraint along all corresponding segments of at least said M RLL rows that correspond to said column parity-check enabling channel word, and
determining an erroneous channel word based on said checking acts.

35. The method according to claim 34, wherein said determining act includes locating an erroneous segment at a crossing point of
a) an erroneous RLL row that violates said row-based parity-check constraint for said RLL row, and
b) an erroneous column comprising all corresponding segments that correspond to a specific column parity-check enabling channel word, wherein said column violates said column-based parity-check constraint.

36. The method according to claim 35, wherein a located erroneous segment is corrected if a single erroneous segment occurs.

37. The method according to claim 34, wherein said determining act is further based on channel side-information if more than a single erroneous segment occurs.

38. The method according to claim 37, wherein said channel side-information is phase-error information of bit transitions in the channel words of the segments at said crossing points.

39. The method according to claim 38, wherein a phase-error with the largest absolute value is determined and the corresponding one-bit of the d,k channel bitstream is shifted by one bit position.

40. The method according to claim 34, wherein said signal comprises said column parity-check enabling channel words at every second channel bit position only, and wherein said determining act includes, upon detecting a first erroneous column, the act of deciding whether another erroneous column is positioned to the left or to the right of said first erroneous column.

41. The method according to claim 40, wherein said decision act is based on channel-side information.

42. The method according to claim 34, wherein said signal comprises segments of more than one successive channel bits of alternating segment width $N_1$ or $N_2$, and
wherein a single-bit transition-shift error is determined internal of such a segment, namely
a) a transition-shift error is determined from bit position i to the right to bit position i+1, if the detected column-based parity-check constraint is detected as $$V_{as\text{-}detected}=N_d(i+1)-N_d(i)$$

and
b) a transition-shift error is determined from bit position i to the left to bit position i−1, if the detected column-based parity-check constraint is detected as $$V_{as\text{-}detected}=N_d(i-1)-N_d(i)$$

wherein $N_d(i-1)$, $N_d(i)$ $N_d(i+1)$ are the numbers of possible d,k constrained sequences of length i−1, i, i+1, respectively.

43. The method according to claim 42, wherein a segment with a determined single-bit transition-shift error is corrected by being replaced by a segment having said unique index $$w_j = w'_j - V_{as\text{-}detected}$$

wherein $w'_j$ is an as-detected index of said segment to be replaced, wherein $$w'_j = \sum_{i=0}^{N_{1,2}-1} b'^j_i \cdot N_d(i)$$

wherein $b'^j_i$ denotes as-detected bit-value for the bit with number i of said segment in row j and wherein $N_d(i)$ is the number of possible d,k constrained sequences of length i.

44. The method according to claim 34, wherein said signal comprises segments of more than one successive channel bits of alternating segment width $N_1$ or $N_2$, and
wherein a single-bit transition-shift error is determined crossing the left boundary of such a segment, namely
a) a transition-shift error is determined from the last bit position of the previous segment to the first bit position of the present segment, if the detected column-based parity-check constraint is detected for the present column as $$V_{as\text{-}detected, present}=+N_d(0)$$

and if the detected column-based parity-check constraint is detected for the previous column as $$V_{as\text{-}detected, previous}=-N_d(N_{1,2}-1)$$

or
b) a transition-shift error is determined from the first bit position of the present segment to the last bit position of the previous segment, if the detected column-based parity-check constraint is detected for the present column as $$V_{as\text{-}detected, present}=-N_d(0)$$

and if the detected column-based parity-check constraint is detected for the previous column as $$V_{as\text{-}detected, previous}=+N_d(N_{1,2}-1)$$

wherein $N_d(0)=1$ and $N_d(N_{1,2}-1)$ is the number of possible d,k constrained sequences of length $N_{1,2}-1$.

45. The method according to claim 34, wherein said signal comprises segments of more than one successive channel bits of alternating segment width $N_1$ or $N_2$, and
wherein a single-bit transition-shift error is determined crossing the right boundary of such a segment, namely
a) a transition-shift error is determined from the last bit position of the present segment to the first bit position of the subsequent segment, if the detected column-based parity-check constraint is detected for the present column as $$V_{as\text{-}detected, present}=-N_d(N_{1,2}-1)$$

and if the detected column-based parity-check constraint is detected for the subsequent column as $$V_{as\text{-}detected, subsequent}+N_d(0)$$

or
b) a transition-shift error is determined from the first bit position of the subsequent segment to the last bit position of the present segment, if the detected column-based parity-check constraint is detected for the present column as $$V_{as\text{-}detected, present}=+N_d(N_{1,2}-1)$$

and if the detected column-based parity-check constraint is detected for the subsequent column as $$V_{as\text{-}detected, subsequent}=-N_d(0)$$

wherein $N_d(0)=1$ and $N_d(N_{1,2}-1)$ is the number of possible d,k constrained sequences of length $N_{1,2}-1$.

46. The device for decoding a signal according to claim 1, comprising:
parity-check means for checking for each RLL row a row-based parity-check constraint, and for checking for each column parity-check enabling channel word of said column parity-check rows a column-based parity-check constraint along all corresponding segments of at least said M RLL rows that correspond to said column parity-check enabling channel word, and
determining means for determining an erroneous channel word based on the result of said parity-checking.

47. The device according to claim 46, wherein said device comprising means for performing a method according to any one of claims 34 to 43.

48. The method for decoding a signal according to any one of claims 34-46, further comprising reading the signal from a storage medium.

49. A method for encoding a stream of user data bits comprising the acts of:
  runlength limited (RLL) encoding said stream of user data bits into a binary d,k channel bitstream comprising RLL rows including a number of sections of respectively N successive RLL channel bits, wherein parameter d defines a minimum number and parameter k defines a maximum number of zeroes between any two ones of said bitstream or vice versa,
  each RLL row representing a parity-check code-word, called row parity-check code-word in which a row-based parity-check constraint for said RLL row has been realized,
  generating column parity-check rows including K sections of respectively N successive channel bits, at predetermined positions of a group of M RLL rows, K, N and M being integer values, said column parity-check rows comprising a plurality of column parity-check enabling channel words,
  wherein each of said column parity-check enabling channel words realizes a column-based parity-check constraint for corresponding segments of at least said M RLL rows of said group that correspond to a specific column parity-check enabling channel word, hereby constituting a column parity-check codeword.

50. The method according to claim 49, further comprising the act of generating a signal according to any one of claims 1 to 31 or 23 to 24.

51. The method according to claim 50, further comprising further comprising the act of storing the signal on a storage medium.

52. A method of decoding a signal encoded according to the method of claim 50, comprising the acts of:
  checking for each RLL row a row-based parity-check constraint,
  checking for each column parity-check segment of said column parity-check rows a so-called column-based parity-check constraint along all corresponding segments of at least said M RLL rows that correspond to said column parity-check enabling channel word, and
  determining an erroneous channel word based on said checking acts.

53. The method according to claim 52, wherein said determining act includes locating an erroneous segment at a crossing point of
  a) an erroneous RLL row that violates said row-based parity-check constraint for said RLL row, and
  b) an erroneous column comprising all corresponding segments that correspond to a specific column parity-check enabling channel word, wherein said column violates said column-based parity-check constraint.

54. The method according to claim 53, wherein a located erroneous segment is corrected if a single erroneous segment occurs.

55. The method according to claim 52, wherein said determining act is further based on channel side-information if more than a single erroneous segment occurs.

56. The method according to claim 55, wherein said channel side-information is phase-error information of bit transitions in the channel words of the segments at said crossing points.

57. The method according to claim 56, wherein a phase-error with the largest absolute value is determined and the corresponding one-bit of the d,k channel bitstream is shifted by one bit position.

58. The method according to claim 52, wherein said signal comprises said column parity-check enabling channel words at every second channel bit position only, and wherein said determining act includes, upon detecting a first erroneous column, act of deciding whether another erroneous column is positioned to the left or to the right of said first erroneous column.

59. The method according to claim 58, wherein said decision act is based on channel-side information.

60. The method according to claim 52, wherein said signal comprises segments of more than one successive channel bits of alternating segment width $N_1$ or $N_2$, and
  wherein a single-bit transition-shift error is determined internal of such a segment, namely
  a) a transition-shift error is determined from bit position i1 to the right to bit position i1, if the detected column-based parity-check constraint is detected as $V_{as-detected} = N_d(i+1) - N_d(i)$ and b) a transition-shift error is determined from bit position i to the left to bit position i−1, if the detected column-based parity-check constraint is detected as $V_{as-detected} = N_d(i-1) - N_d(i)$ wherein $N_d(i-1)$, $N_d(i)$ and $N_d(i+1)$ are the numbers of possible d,k constrained sequences of length i−1, i, i+1, respectively.

61. The method according to claim 60, wherein a segment with a determined single-bit transition-shift error is corrected by being replaced by a segment having said unique index $w_j = w'_j - V_{as-detected}$ wherein $w'_j$ is an as-detected index of said segment to be replaced, wherein $$w'_j = \sum_{i=0}^{N_{1,2}-1} b'^j_i \cdot N_d(i)$$

wherein $b'^j_i$ denotes as-detected bit-value for the bit with number i of said segment in row j and wherein $N_d(i)$ is the number of possible d,k constrained sequences of length i.

62. The method according to claim 52, wherein said signal comprises segments of more than one successive channel bits of alternating segment width $N_1$ or $N_2$, and
  wherein a single-bit transition-shift error is determined crossing the left boundary of such a segment, namely
  a) a transition-shift error is determined from the last bit position of the previous segment to the first bit position of the present segment, if the detected column-based parity-check constraint is detected for the present column as $V_{as-detected,present} = +N_d(0)$ and if the detected column-based parity-check constraint is detected for the previous column as $$V_{as\text{-}detected,previous}=-N_d(N_{1,2}-1)$$

or b) a transition-shift error is determined from the first bit position of the present segment to the last bit position of the previous segment, if the detected column-based parity-check constraint is detected for the present column as $$V_{as\text{-}detected,present}=-N_d(0)$$

and if the detected column-based parity-check constraint is detected for the previous column as $$V_{as\text{-}detected,previous}=+N_d(N_{1,2}-1)$$

wherein $N_d(0)=1$ and $N_d(N_{1,2}-1)$ is the number of possible d,k constrained sequences of length $N_{1,2}-1$.

63. The method according to claim 52, wherein said signal comprises segments of more than one successive channel bits of alternating segment width $N_1$ or $N_2$, and wherein a single-bit transition-shift error is determined crossing the right boundary of such a segment, namely a) a transition-shift error is determined from the last bit position of the present segment to the first bit position of the subsequent segment, if the detected column-based parity-check constraint is detected for the present column as $$V_{as\text{-}detected,present}=-N_d(N_{1,2}-1)$$

and if the detected column-based parity-check constraint is detected for the subsequent column as $$V_{as\text{-}detected,subsequent}=+N_d(0)$$

or b) a transition-shift error is determined from the first bit position of the subsequent segment to the last bit position of the present segment, if the detected column-based parity-check constraint is detected for the present column as $$V_{as\text{-}detected,present}=+N_d(N_{1,2}-1)$$

and if the detected column-based parity-check constraint is detected for the subsequent column as $$V_{as\text{-}detected,subsequent}=-N_d(0)$$

wherein $N_d(0)=1$ and $N_d(N_{1,2}-1)$ is the number of possible d,k constrained sequences of length $N_{1,2}-1$.

64. A device for decoding a signal encoded according to the method of claim 50, comprising:

parity-check means for checking for each RLL row a row-based parity-check constraint, and for checking for each column parity-check enabling channel word of said column parity-check rows a column-based parity-check constraint along all corresponding segments of at least said M RLL rows that correspond to said column parity-check enabling channel word, and determining means for determining an erroneous channel word based on the result of said parity-checking.

65. The method according to claim 49, further comprising the act of storing the signal on a storage medium.

66. A method of decoding the signal according to any one of claims 2 to 31 or 23 to 24 or a signal encoded according to the method of claim 49, comprising the acts of:

checking for each RLL row a row-based parity-check constraint, checking for each column parity-check segment of said column parity-check rows a column-based parity-check constraint along all corresponding segments of at least said M RLL rows that correspond to said column parity-check enabling channel word, and determining an erroneous channel word based on said checking acts.

67. The method according to claim 66, wherein said determining act includes locating an erroneous segment at a crossing point of a) an erroneous RLL row that violates said row-based parity-check constraint for said RLL row, and b) an erroneous column comprising all corresponding segments that correspond to a specific column parity-check enabling channel word, wherein said column violates said column-based parity-check constraint.

68. The method according to claim 67, wherein a located erroneous segment is corrected if a single erroneous segment occurs.

69. The method according to claim 66, wherein said determining act is further based on channel side-information if more than a single erroneous segment occurs.

70. The method according to claim 69, wherein said channel side-information is phase-error information of bit transitions in the channel words of the segments at said crossing points.

71. The method according to claim 70, wherein a phase-error with the largest absolute value is determined and the corresponding one-bit of the d,k channel bitstream is shifted by one bit position.

72. The method according to claim 66, wherein said signal comprises said column parity-check enabling channel words at every second channel bit position only, and wherein said determining act includes, upon detecting a first erroneous column, the act of deciding whether another erroneous column is positioned to the left or to the right of said first erroneous column.

73. The method according to claim 72, wherein said decision act is based on channel-side information.

74. The method according to claim 66, wherein said signal comprises segments of more than one successive channel bits of alternating segment width $N_1$ or $N_2$, and wherein a single-bit transition-shift error is determined internal of such a segment, namely a) a transition-shift error is determined from bit position i to the right to bit position i+1, if the detected column-based parity-check constraint is detected as $$V_{as\text{-}detected}=N_d(i+1)-N_d(i)$$

and b) a transition-shift error is determined from bit position i to the left to bit position i−1, if the detected column-based parity-check constraint is detected as $$V_{as\text{-}detected}=N_d(i-1)-N_d(i)$$

wherein $N_d(i-1)$, $N_d(i)$ and $N_d(i+1)$ are the numbers of possible d,k constrained sequences of length i−1, i, i+1, respectively.

75. The method according to claim 74, wherein a segment with a determined single-bit transition-shift error is corrected by being replaced by a segment having said unique index $$w_j=w'_j-V_{as\text{-}detected}$$

wherein $w'_j$ is an as-detected index of said segment to be replaced, wherein $$w'_j = \sum_{i=0}^{N_{1,2}-1} b'^j_i \cdot N_d(i)$$

wherein $b'^j_i$ denotes as-detected bit-value for the bit with number i of said segment in row j and wherein $N_d(i)$ is the number of possible d,k constrained sequences of length i.

76. The method according to claim 66, wherein said signal comprises segments of more than one successive channel bits of alternating segment width $N_1$ or $N_2$, and
wherein a single-bit transition-shift error is determined crossing the left boundary of such a segment, namely
a) a transition-shift error is determined from the last bit position of the previous segment to the first bit position of the present segment, if the detected column-based parity-check constraint is detected for the present column as $V_{as\text{-}detected, present} = +N_d(0)$ and if the detected column-based parity-check constraint is detected for the previous column as $V_{as\text{-}detected, previous} = -N_d(N_{1,2}-1)$ or
b) a transition-shift error is determined from the first bit position of the present segment to the last bit position of the previous segment, if the detected column-based parity-check constraint is detected for the present column as $V_{as\text{-}detected, present} = -N_d(0)$ and if the detected column-based parity-check constraint is detected for the previous column as $V_{as\text{-}detected, previous} = +N_d(N_{1,2}-1)$ wherein $N_d(0)=1$ and $N_d(N_{1,2}-1)$ is the number of possible d,k constrained sequences of length $N_{1,2}-1$.

77. The method according to claim 66, wherein said signal comprises segments of more than one successive channel bits of alternating segment width $N_1$ or $N_2$, and
wherein a single-bit transition-shift error is determined crossing the right boundary of such a segment, namely
a) a transition-shift error is determined from the last bit position of the present segment to the first bit position of the subsequent segment, if the detected column-based parity-check constraint is detected for the present column as $V_{as\text{-}detected, present} = -N_d(N_{1,2}-1)$ and if the detected column-based parity-check constraint is detected for the subsequent column as $V_{as\text{-}detected, subsequent} = +N_d(0)$ or
b) a transition-shift error is determined from the first bit position of the subsequent segment to the last bit position of the present segment if the detected column-based parity-check constraint is detected for the present column as $V_{as\text{-}detected, present} = +N_d(N_{1,2}-1)$ and if the detected column-based parity-check constraint is detected for the subsequent column as $V_{as\text{-}detected, subsequent} = -N_d(0)$ wherein $N_d(0)=1$ and $N_d(N_{1,2}-1)$ is the number of possible d,k constrained sequences of length $N_{1,2}-1$.

78. A device for decoding a signal according to any one of claims 2 to 31 or 23 to 24 or a signal encoded according to the method of claim 49, comprising:
parity-check means for checking for each RLL row a row-based parity-check constraint, and for checking for each column parity-check enabling channel word of said column parity-check rows a column-based parity-check constraint along all corresponding segments of at least said M RLL rows that correspond to said column parity-check enabling channel word, and
determining means for determining an erroneous channel word based on the result of said parity-checking.

79. A device for encoding a stream of user data bits comprising:
encoding means for runlength limited (RLL) encoding a stream of user data bits into a binary d,k channel bitstream comprising a number of sections of respectively N successive RLL channel bits, called RLL rows, wherein parameter d defines a minimum number and parameter k defines a maximum number of zeroes between any two ones of said bitstream or vice versa,
wherein each RLL row represents a parity-check code-word, called row parity-check code-word in which a row-based parity-check constraint for said RLL row has been realized,
wherein said encoding means is designed for generating column parity-check rows including K sections of respectively N successive channel bits, at predetermined positions of a group of M RLL rows, K, N and M being integer values, said column parity-check rows comprising a plurality of column parity-check enabling channel word, wherein each of said column parity-check enabling channel words realizes a column-based parity-check constraint for all corresponding segments of at least said M RLL rows of said group that correspond to a specific column parity-check enabling channel word, hereby constituting a column parity-check codeword.

80. The device according to claim 79, further comprising means for performing a method according to claims 49 in order to generate a signal according to any one of claims 1 to 31 or 23 to 24.

81. The device according to claim 80, further comprising means for storing the signal on a storage medium.

82. The device according to claim 79, further comprising means for performing a method according to claim 50.

83. The device according to claim 79, further comprising means for storing the signal on a storage medium.

* * * * *